US009245591B2

(12) United States Patent
Booth

(10) Patent No.: US 9,245,591 B2
(45) Date of Patent: *Jan. 26, 2016

(54) ADDRESSING, COMMAND PROTOCOL, AND ELECTRICAL INTERFACE FOR NON-VOLATILE MEMORIES UTILIZED IN RECORDING USAGE COUNTS

(71) Applicant: Lexmark International, Inc., Lexington, KY (US)

(72) Inventor: James Ronald Booth, Nicholasville, KY (US)

(73) Assignee: Lexmark International, Inc., Kentucky ( * ) Notice: Subject to any disclaimer, the term of this patent is extended or adjusted under 35 U.S.C. 154(b) by 0 days.

This patent is subject to a terminal disclaimer.

(21) Appl. No.: 14/198,088

(22) Filed: Mar. 5, 2014

(65) Prior Publication Data

US 2014/0189451 A1 Jul. 3, 2014

Related U.S. Application Data

(63) Continuation-in-part of application No. 14/053,566, filed on Oct. 14, 2013, and a continuation of application No. 13/174,759, filed on Jun. 30, 2011, now Pat. No. 8,966,193, and a continuation of application No. 11/406,542, filed on Apr. 19, 2006, now Pat. No. 8,521,970.

(51) Int. Cl.
G06F 12/00 (2006.01)
G11C 5/06 (2006.01)
G06F 13/42 (2006.01)
(Continued)

(52) U.S. Cl.
CPC ............ *G11C 5/066* (2013.01); *G06F 13/4243* (2013.01); *G11C 7/109* (2013.01); *G11C 16/32* (2013.01); *Y02B 60/1228* (2013.01); *Y02B 60/1235* (2013.01)

(58) Field of Classification Search
CPC ...... G06F 3/067; G06F 3/0605; G06F 3/0659
See application file for complete search history.

(56) References Cited

U.S. PATENT DOCUMENTS

| 3,651,487 | A | * | 3/1972 | Washington | ................. 358/1.16 |
| 4,443,845 | A | * | 4/1984 | Hamilton et al. | ............. 710/300 |
| 4,586,147 | A | | 4/1986 | Tadokoro | |

(Continued)

FOREIGN PATENT DOCUMENTS

EP 2237163 A1 10/2010

OTHER PUBLICATIONS

Supplemental European Search Report for related European Application EP06784708 (Oct. 2009), 4 pages.

(Continued)

*Primary Examiner* — Charles Rones
*Assistant Examiner* — Nanci Wong

(57) ABSTRACT

A memory module, including a plurality of memory cells and a plurality of signal lines for communicating with a processing device. The memory module is configured such that following reception of a command and upon encountering a first condition while processing the command, the memory module limits a voltage on a first signal line of the plurality of signal lines to be no more than an intermediate voltage greater than voltage levels corresponding to a binary zero state and less than voltage levels corresponding to a binary one state for a period of time for indicating an occurrence of the first condition.

16 Claims, 14 Drawing Sheets

(51) Int. Cl.
*G11C 7/10* (2006.01)
*G11C 16/32* (2006.01)

(56) References Cited

U.S. PATENT DOCUMENTS

| | | | |
|---|---|---|---|
| 4,631,428 A | 12/1986 | Grimes | |
| 4,689,740 A | 8/1987 | Moelands et al. | |
| 4,908,827 A * | 3/1990 | Gates | 714/790 |
| 5,023,813 A | 6/1991 | Brown, III | |
| 5,044,790 A | 9/1991 | Kawamura | |
| 5,297,269 A | 3/1994 | Donaldson et al. | |
| 5,404,464 A * | 4/1995 | Bennett | 710/306 |
| 5,412,788 A * | 5/1995 | Collins et al. | 711/157 |
| 5,479,467 A | 12/1995 | Katsumata | |
| 5,493,672 A * | 2/1996 | Lau et al. | 703/21 |
| 5,544,175 A * | 8/1996 | Posse | 714/736 |
| 5,600,587 A * | 2/1997 | Koike | 365/145 |
| 5,668,803 A * | 9/1997 | Tymes et al. | 370/312 |
| 5,689,196 A | 11/1997 | Schutte | |
| 5,710,734 A | 1/1998 | Park | |
| 5,995,774 A | 11/1999 | Applegate et al. | |
| 6,002,846 A | 12/1999 | Okamoto | |
| 6,052,547 A | 4/2000 | Cuzzo et al. | |
| 6,078,985 A | 6/2000 | Lakhani et al. | |
| 6,249,838 B1 | 6/2001 | Kon | |
| 6,253,277 B1 | 6/2001 | Lakhani et al. | |
| 6,271,928 B1 | 8/2001 | Bullock et al. | |
| 6,307,779 B1 | 10/2001 | Roohparvar | |
| 6,442,076 B1 | 8/2002 | Roohparvar | |
| 6,515,982 B1 * | 2/2003 | Hagiwara | 370/347 |
| 6,545,981 B1 * | 4/2003 | Garcia et al. | 370/242 |
| 6,641,312 B1 * | 11/2003 | Chang et al. | 400/76 |
| 6,665,092 B2 | 12/2003 | Reed et al. | |
| 6,760,274 B2 | 7/2004 | Roohparvar | |
| 6,876,563 B1 | 4/2005 | Manapat et al. | |
| 7,089,391 B2 * | 8/2006 | Geiger et al. | 711/170 |
| 7,219,199 B1 * | 5/2007 | Rodi et al. | 711/155 |
| 7,444,479 B2 * | 10/2008 | Alexander et al. | 711/154 |
| 7,844,786 B2 * | 11/2010 | Booth et al. | 711/156 |
| 7,908,470 B1 | 3/2011 | Cavanna | |
| 2001/0021958 A1 * | 9/2001 | Zink et al. | 711/103 |
| 2002/0029327 A1 * | 3/2002 | Roth | 711/217 |
| 2002/0054508 A1 * | 5/2002 | Nozoe et al. | 365/185.09 |
| 2002/0085433 A1 | 7/2002 | Tomori et al. | |
| 2003/0011409 A1 | 1/2003 | Altrichter et al. | |
| 2003/0043408 A1 | 3/2003 | Fields et al. | |
| 2003/0093612 A1 | 5/2003 | Ootani et al. | |
| 2003/0133331 A1 | 7/2003 | Laberge | |
| 2003/0198100 A1 | 10/2003 | Matsushita et al. | |
| 2003/0218930 A1 | 11/2003 | Lehmann et al. | |
| 2004/0025040 A1 | 2/2004 | Aoki et al. | |
| 2004/0063496 A1 | 4/2004 | Dabrowski | |
| 2004/0133794 A1 | 7/2004 | Kocher et al. | |
| 2004/0178278 A1 | 9/2004 | Fruhauf et al. | |
| 2004/0221075 A1 * | 11/2004 | Dobson et al. | 710/39 |
| 2004/0223011 A1 | 11/2004 | Adkins et al. | |
| 2005/0036620 A1 | 2/2005 | Casden et al. | |
| 2005/0066141 A1 * | 3/2005 | Choi | 711/168 |
| 2005/0073033 A1 | 4/2005 | Yoo et al. | |
| 2005/0120260 A1 * | 6/2005 | Suzuki et al. | 714/5 |
| 2006/0214961 A1 * | 9/2006 | Nakahara | 347/14 |
| 2007/0077074 A1 * | 4/2007 | Adkins et al. | 399/12 |
| 2007/0150672 A1 * | 6/2007 | Alexander et al. | 711/154 |
| 2009/0060191 A1 * | 3/2009 | Yabuno | 380/268 |
| 2010/0328983 A1 | 12/2010 | Cheng | |
| 2012/0194868 A1 * | 8/2012 | Gravely et al. | 358/1.16 |

OTHER PUBLICATIONS

"Development of Ternary Computers at Moscow State University," Russian Virtual Computer Museum, //www.computer-museum.ru/english/setun.htm, pp. 1-5, exact date unknown.
"Ternary Computer," Wikipedia, //www.en.wikipedia.org/wiki/Ternary_computer, Jun. 3, 2014, 4 pages.
"Ternary Computer," Wikipedia, //www.en.wikipedia.org/wiki/Ternary_computer, Oct. 29, 2005, 1 page.
"Ternac," Wikipedia, //www.en.wikipedia.org.wiki/Ternac, Mar. 24, 2014, 2 pages.
AN10216-01 Jean-Marc Irazabal, Steve Blozis, "I2C Manual," Application Note, Philips Semiconductors, pp. 1-51 (Mar. 2003).
DS1961A, "1kb Protected EEPROM iButton with SHA-1 Engine," Dallas Semiconductor, www.maxim-ic.com, pp. 1-36 (date unknown).
"The I2C-Bus Specification" Version 2.1, Philips Semiconductors, pp. 1-46, (Jan. 2000).

* cited by examiner

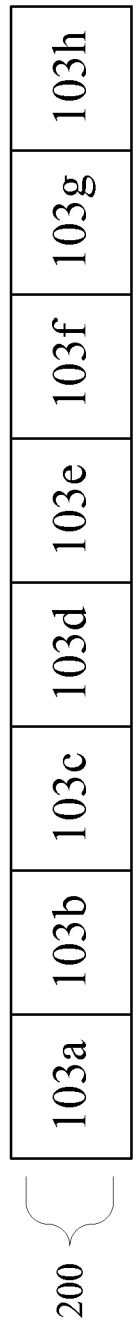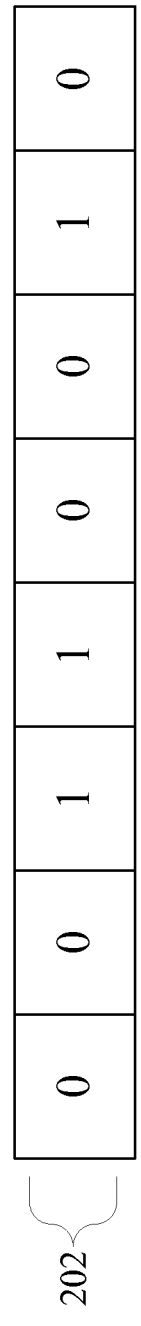
FIG. 2A
FIG. 2B

ADDRESSING, COMMAND PROTOCOL, AND ELECTRICAL INTERFACE FOR NON-VOLATILE MEMORIES UTILIZED IN RECORDING USAGE COUNTS

CROSS REFERENCE TO RELATED APPLICATIONS

Pursuant to 37 C.F.R. §1.78, this application is a continuation-in-part application and claims the benefit of the earlier filing date of application Ser. No. 14/053,566, filed Oct. 14, 2013, entitled, "Improved Address, Command Protocol, and Electrical Interface for Non-Volatile Memories Utilized in Recording Usage Counts," which itself is a continuation application and claims the benefit of the earlier filing date of application Ser. No. 13/174,759, filed Jun. 30, 2011, entitled "Improved Addressing, Command Protocol, and Electrical Interface for Non-Volatile Memories Utilized in Recording Usage Counts," which itself is a continuation application and claims the benefit of the earlier filing date of application Ser. No. 11/406,542, filed Apr. 19, 2006, entitled "Addressing, Command Protocol, and Electrical Interface for Non-Volatile Memories Utilized in Recording Usage Counts," now U.S. Pat. No. 8,521,970. The content of each of the above applications is hereby incorporated by reference as if fully set forth herein.

In addition, this present application is related to U.S. application Ser. No. 11/154,117, filed Jun. 16, 2005, which is hereby incorporated by reference herein as if fully set forth herein.

FIELD OF THE INVENTION

The present invention relates generally to non-volatile memories, and more specifically, to addressing schemes, command protocols, and electrical interfaces for non-volatile memories utilized in recording the usage of a device.

BACKGROUND OF THE INVENTION

Non-volatile memory modules are commonly found in computing devices for recording the usage of components, including consumable components having a limited life span. For instance, non-volatile memory modules are common in imaging and printing devices, such as in multifunction printers, for recording the use of components such as fusers, accumulation belts, and the like, and for recording the use of consumables such as print cartridges. In imaging or printing devices, for instance, usage may be recorded based upon the number of pages printed by the device, or based upon the partial or full depletion of the print cartridges. Such usage counts are helpful in a variety of ways, including for billing purposes and in monitoring the status and/or use of consumable components.

As computing devices have advanced and become more complex, the number of non-volatile memory modules included within each device has increased. The speed with which each non-volatile memory module must be updated or read in a computing device has also increased. Continuing with the illustrative example of printing and imaging devices, the speed and page rates of these devices are constantly improving. Therefore, not only do the contents of a greater number of non-volatile memory modules have to be updated, but the contents of these memory modules must be updated in a shorter amount of time to keep up with the faster page rates. In imaging and printing devices, because conventional many memory modules have relatively long wait times for updating, faster page rates present difficulties in updating each of the non-volatile memories in a device in a timely manner.

In addition, non-volatile memory modules (e.g., EEPROM, NOR flash memory, NAND flash memory, etc.) in computing devices may experience degradation during operation, thereby necessitating error handling to mitigate interruption of operation of the memory modules. Further, non-volatile memory modules may be physically part of removeable and/or consumable components of a computing device, such as printer cartridges. Because such removable and/or consumable components should be easily installed and removed by users, there is a cost premium associated with each electrical connection between the computing device and it's removeable and/or consumable component, as exists, for instance, with a printing device and a printer cartridge. By utilizing multi-level or analog level communication techniques appropriately, the number of these electrical connections can be minimized, thereby helping to increase reliability and decrease cost.

Conventional protocols do not sufficiently handle all of these problems discussed. Thus, there remains an unsatisfied need in the industry for addressing schemes, command protocols, and electrical interfaces for quickly updating non-volatile memories, such as in non-volatile memory modules utilized in imaging and printing devices.

BRIEF SUMMARY OF THE INVENTION

The present invention overcomes the disadvantages of the prior art by providing addressing schemes, command protocols, and electrical interfaces that quickly update memory modules, such as non-volatile memory modules, in computing devices such as imaging and printing devices.

According to one example embodiment, there is shown a memory module, including a plurality of memory cells; and a plurality of signal lines for communicating with a processing device. The memory module is configured such that following reception of a command and upon encountering a first condition while processing the command, the memory module limits a voltage on a first signal line of the plurality of signal lines to be no more than an intermediate voltage greater than voltage levels corresponding to a binary zero state and less than voltage levels corresponding to a binary one state for a period of time for indicating an occurrence of the first condition. In the example embodiment, the memory module is configured to receive a first signal on the first signal line. During the period of time, the memory module limits a voltage on the first signal line to be no greater than the intermediate voltage, a voltage level on the first signal line corresponding to the binary zero state is interpreted by the memory module as a binary zero state of the first signal and the intermediate voltage on the first signal line is interpreted by the memory module as a binary one state of the first signal. In this way, the memory module is able to communicate the occurrence of the first condition on the same signal line on which the first signal is received, thereby eliminating the need for an additional signal line over which to communicate the occurrence of the first condition.

In an example embodiment, the first signal is a clock signal and the first condition is a busy condition. In another example embodiment, the first signal is an address-data signal and the first condition is an error condition.

In yet another example embodiment, an apparatus includes a first signal line for communicating clock and busy status information, and a second signal line for communicating address, data and error status information. The apparatus further includes a memory module configured to receive and process commands. The memory module includes a plurality of memory cells and circuitry, coupled to the first signal line and the second signal line, for setting an upper voltage level for at least one of the first signal line and the second signal line in response to encountering at least one condition of the memory module during processing of a command. The circuitry may switch the upper voltage level for the at least one of the first signal line and second signal line between a first voltage and a second voltage, the first voltage being a voltage at which the memory module is powered. The apparatus may further include a voltage regulator which generates the second voltage, the second voltage being greater than the first voltage.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 2A and 2B are illustrative memory module addresses according to an embodiment of the present invention.

DETAILED DESCRIPTION OF THE INVENTION

Figure 1A:
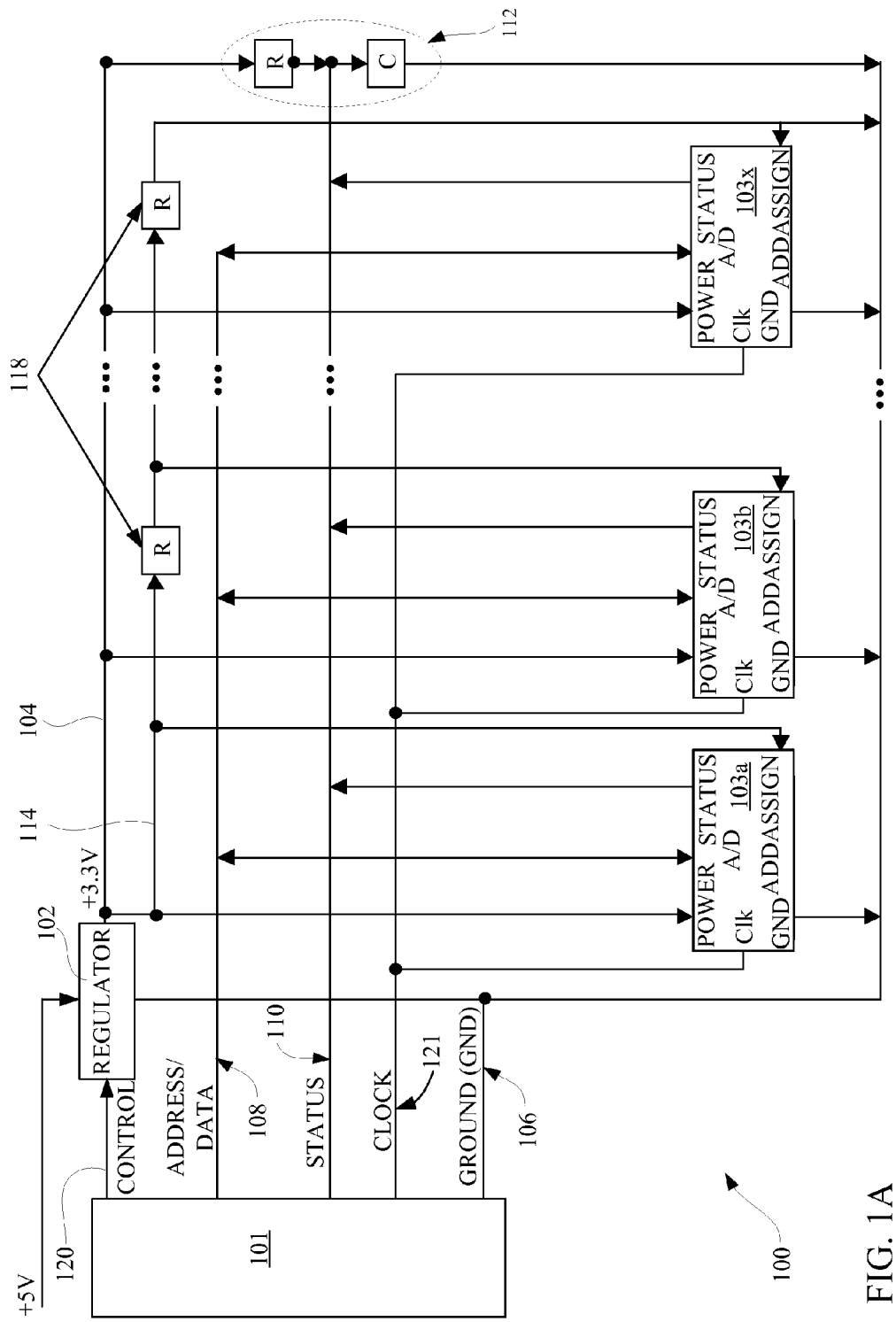
FIG. 1A is a schematic of an illustrative electrical interface, according to an embodiment of the present invention.

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Further, although the present invention is described in the context of addressing schemes, command protocols, and electrical interfaces for quickly updating non-volatile memories in imaging and printing devices, it will be appreciated that the present invention may be implemented in any device having non-volatile memories. This may include mobile phones, handheld computers, laptop computers, personal computers, servers, mainframe computers, personal digital assistants, and the like, and devices having minimal processing power and functionality, such as in devices with dedicated circuits for performing preprogrammed or uncomplicated tasks. In brief, the present invention may be implemented in any computing device in which the usage of components may wish to be recorded using non-volatile memory. Therefore, the embodiments herein describing non-volatile memories for tallying page counts and recording the depletion of ink in ink or toner cartridges are for illustrative purposes only and are not intended to be limiting examples.

In imaging and printing devices, page counts recorded by non-volatile memory modules ("memory modules") may be incremented as pages are printed. Page counts may include the total number of pages printed by a printer and the total number of pages printed for each of a number of print categories. Recording the number of pages for individual print categories permits the recording of page counts for specific types of printing tasks, such as the total number of color pages, monochrome pages, letter size pages, legal size pages, transparencies, etc., that may be printed. In addition to recording page counts, non-volatile memory modules may be packaged with reservoirs such as ink or toner cartridges, and the memory modules may contain one or more bit fields for recording the depletion of the reservoirs. By comparison, each bit field may be in either an erased or programmed state (e.g., a "0" or "1") while each page count may include a plurality of bits representing a numeric value. As an example, a non-volatile memory module provided with a toner cartridge may contain thirty-two bit fields, and as a particular amount of toner has been depleted (e.g., $\frac{1}{32}$ of the total toner), a bit field may be "punched out," thereby changing the bit field from an erased state to a programmed state. For instance, the value in the bit field may be changed from an initial value of "0" to a value of "1". In this illustrative example, all thirty-two bit fields may be punched out after all of the toner had been depleted, thereby signifying full depletion of the toner cartridge. It will be appreciated by one of ordinary skill in the art that imaging and printing devices may contain non-volatile memory modules that have one or more counts, resource bit fields, or a combination thereof.

Embodiments of the present invention describe electrical interfaces, addressing schemes, and command protocols for efficiently commanding a single memory module, a group of memory modules, or all of the memory modules in an imaging or printing device. According to one aspect of the invention, each memory module in the imaging or printing device may be directed to increment one or more page counts by a specified value or to punch out a resource bit field. In order to direct a group of memory modules with a common command, the group of memory modules may be synchronized prior to issuance of the command. Further, memory modules may be able to report errors and obtain assistance in resolving those errors from a processing device. A given count or resource bit field in a non-volatile memory module may degrade with use, and therefore it may be necessary to adjust the location of the count or bit field.

I. Electrical Interface

FIG. 1A illustrates an electrical interface 100 according to an illustrative embodiment of the present invention. The interface 100 includes a processing device 101 in communication with a plurality of non-volatile memory modules 103a, 103b, . . . 103x, which may contain one or more counts, bit fields, or a combination thereof. According to one aspect of the invention, the processing device 101 may be an application-specific integrated circuit (ASIC). According to another aspect of the invention, the processing device 101 may be a general processor or microprocessor running on a computing device to execute the functions described herein. To implement the functions described herein, the processing device 101 may also include software, hardware, or a combination thereof, and may include one or more integrated components in close proximity or components that are distributed throughout an imaging and printing device.

As shown in FIG. 1A, the processing device 101 controls a voltage regulator 102 that provides a voltage source 104 to the memory modules 103a, 103b, . . . 103x. According to a preferred embodiment, the voltage source for the memory modules 103a, 103b, . . . 103x may be a common voltage source. The memory modules 103a, 103b, . . . 103x in the illustrative electrical interface 100 operate at 3.3V, but it will be appreciated by one of ordinary skill in the art that non-volatile memory modules such as the memory modules 103a, 103b, . . . 103x shown in FIG. 1 may operate at other voltages. As illustrated in FIG. 1A, the non-volatile memory modules 103a, 103b, . . . 103x are also provided with a common ground reference 106.

The processing device 101 may exchange data with one or more of the non-volatile memory modules 103a, 103b, . . . 103x through an address/data channel 108. According to one embodiment of the present invention, the address/data channel 108 may include a unidirectional first channel and a unidirectional second channel. In particular, data from the processing device 101 may be sent over the first channel to the memory modules 103a, 103b, . . . 103x using an asynchronous modulation technique and a transmission rate supported by the memory modules 103a, 103b, . . . 103x. Similarly, data may be sent from the memory modules 103a, 103b, . . . 103x to the processing device 101 over the second channel utilizing an asynchronous modulation technique and a transmission rate supported by the memory modules 103a, 103b, . . . 103x. According to one aspect of the invention, the transmission rate may be common to all of the memory modules 103a, 103b, . . . 103x. In a preferred embodiment, the transmission rates for both the first and second channels may be between approximately 38,400 bits/second and 115,200 bits/second, though the transmission rates may vary depending on the specific types of memory modules utilized. It will be appreciated that other transmission rates may also be used, including those not supported by all of the memory modules 103a, 103b, . . . 103x. For example, one memory module may transmit a response to a read command at a faster rate than another memory module.

According to other embodiments of the present invention, the address/data channel 108 may only include a single bidirectional channel capable of sending and receiving data between the processing device 101 and the memory modules 103a, 103b, . . . 103x. A single bi-directional address/data channel 108 may use an asynchronous modulation technique and a transmission rate supported by the memory modules 103a, 103b, . . . 103x. When a single bi-directional channel is used, the processing device 101 may wait before current commands in process are completed before issuing additional commands to the memory modules 103a, 103b, . . . 103x. In addition, it will be appreciated that any command requiring a response from a memory module 103a, 103b, . . . 103x may be issued over the address/data channel 108 to a single memory module 103a, 103b, . . . 103x at a time. To prevent other memory modules from utilizing the address/data channel 108 while another memory module is transmitting data, a half-duplex sharing technique or other scheduling method may be implemented. Furthermore, it will be appreciated by those of ordinary skill in the art that other alternatives for the address/data channel 108 may be possible to execute the processing device's 101 exchange data with one or more of the non-volatile memory modules 103a, 103b, . . . 103x, such as the use of two bi-directional channels, and that other transmission techniques known to those of ordinary skill in the art may be used to effect communication via the address/data channel 108.

As illustrated in FIG. 1A, the processing device 101 receives the status of the memory modules 103a, 103b, . . . 103x through a status channel 110. According to one embodiment of the present invention, the status channel 110 may include a first channel representing a busy/available status and a second channel representing an error/no-error status. In a preferred embodiment, the busy/available status may be provided on the first channel by effectively "anding" the busy/available output signals from each of the memory modules through the use of an open-collector/open-drain 112. The open-collector/open-drain 112 may include one or more common resistors and one or more capacitors. In such a configuration, each memory module 103a, 103b, . . . 103x may output a high voltage signal if it is able to accept a command, or a low voltage signal if it is busy executing a command. Thus, if all of the memory modules 103a, 103b, . . . 103x are available, then the first channel signal may be pulled up to a "high" voltage by the resistor in the open-collector/open-drain 112, signifying that all of the memory modules 103a, 103b, . . . 103x are available.

On the other hand, if any memory module 103a, 103b, . . . 103x is busy, then the first channel signal may be pulled to a "low" voltage close to ground by the open-collector/open-drain 112. If at least one memory module 103a, 103b, . . . 103x is busy, the processing device 101 may wait until the first channel signal is pulled to a high voltage level before issuing a subsequent command to the memory modules 103a, 103b, . . . 103x. In this manner, the processing device 101 may synchronize the memory modules 103a, 103b, . . . 103x before issuing a common command, such as an increment counter command, to a plurality of the memory modules 103a, 103b, . . . 103x. Similarly, the second channel may also effectively "and" the error/no-error output signals from each of the memory modules. This may also be provided with another open-collector/open-drain 112 having a common resistor and capacitor.

Each of the memory modules 103a, 103b, . . . 103x may output a high voltage signal on the second channel when there is no error detected and a low voltage signal if an error is detected. Thus, if one of the memory modules 103a, 103b, . . . 103x has an error, the second channel may be pulled to a low voltage by the open-collector/open-drain 112, signifying that at least one memory module 103a, 103b, . . . 103x contains an error. If all of the memory modules 103a, 103b, . . . 103x are error-free, then the second channel may be pulled to a high voltage. All of the memory modules 103a, 103b, . . . 103x will be ready and error-free if the first and second channels are at a high voltage level. It will be appreciated by one of ordinary skill that there are many alternatives to the "anding" function of open-collector/open drain 112 discussed above. For example, a plurality of physical "and" gates can be used instead of the open-collector/open-drain 112.

According to another embodiment of the present invention, the status channel 110 may include only a single channel capable of representing the ready, error, and busy states for the memory modules 103a, 103b, . . . 103x. When only a single channel is used, all addressed memory modules 103a, 103b, . . . 103x may release their respective busy signals from a low voltage level to a high voltage level after each finishes processing its current command. The status channel 110 may then be pulled to a high voltage level by the open-drain/open-collector 112. Once the addressed memory modules 103a, 103b, . . . 103x have completed their commands and released each of their output signals above the low voltage, any memory module that needs to report an error may hold the status channel 110 at an intermediate voltage level that is higher than the low voltage level (e.g., close to ground) but lower than the high voltage (e.g., approximately 3.3V). For instance, each of the memory modules 103a, 103b, . . . 103x may use a 1.5V zener diode component to ground to provide the intermediate voltage level. Other methods of providing an intermediate voltage level may alternatively be implemented using resistors, as is known in the art, such as using a 5.1K Ω resistance to ground to provide the intermediate voltage level. In this way, a single status channel 110 may be sufficient for reporting the ready, error, and busy states of the memory modules 103a, 103b, . . . 103x thereby reducing the electrical connections required between the processing device 101 and the memory modules 103a, 103b, . . . 103x.

It will be appreciated by one of ordinary skill in the art that the low, high, and intermediate voltage levels do not have to correspond to the busy, error, and ready status, respectively, of the memory modules 103a, 103b, . . . 103x. According to an alternative embodiment, the low voltage level may correspond to a ready status while a high voltage level may correspond to a busy level. According to another embodiment, the address/data channel 108 may be utilized to transmit the status of one or more of the memory modules 103a, 103b, . . . 103x to the processing device 101. For example, the processing device may wait to receive a ready status from each of the memory modules 103a, 103b, . . . 103x on the address/data channel 108 before issuing a subsequent command.

As illustrated in FIG. 1A, the controlling computer system 101 may also provide a common time reference to the memory modules 103a, 103b, . . . 103x through a clock channel 121. According to one embodiment of the present invention, the clock channel 121 may operate at a frequency directly correlated to the bit rate of the Address/Data channel 108 or may operate at a frequency unrelated to this bit rate. Phase-locked-loop circuits present in each memory module 103a, 103b, . . . 103x may use the common time reference provided by the clock channel 121. It will be appreciated by one of ordinary skill in the art that the clock channel 121 may either be a fixed frequency or a modulated frequency to spread the electromagnetic emissions associated with the clock channel 121 over a wider frequency range.

Figure 1B:
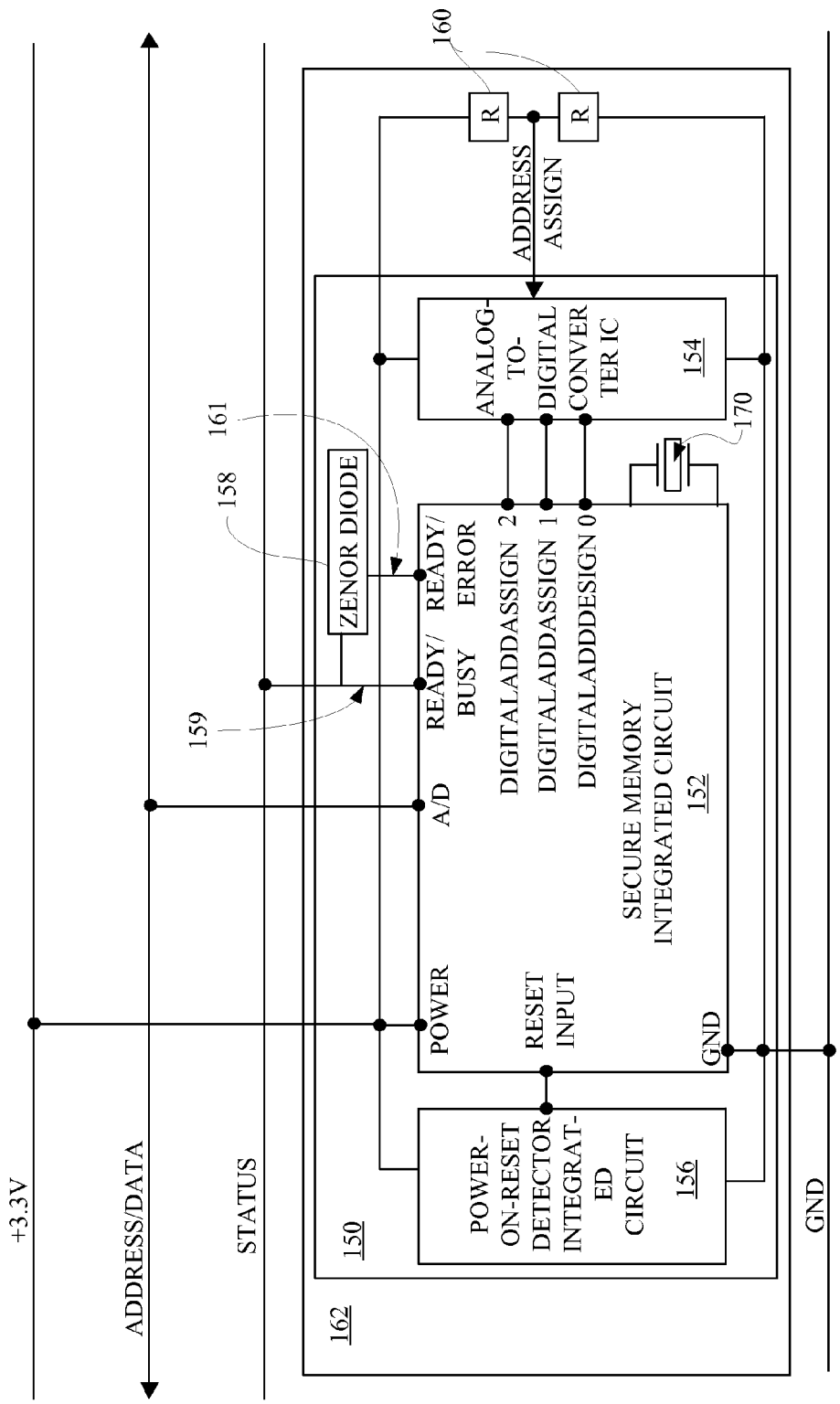
FIG. 1B is a schematic of an alternative manner by which the electrical interface of FIG. 1A may be achieved by an electronic assembly including integrated circuits, according to an illustrative embodiment of the present invention.

FIG. 1B is a schematic showing an alternative manner by which the memory modules 103a, 103b, . . . 103x in the illustrative electrical interface of FIG. 1A may be achieved via an electronic assembly 162 including several integrated circuits, according to an illustrative embodiment of the present invention. More specifically, in FIG. 1B an electronic assembly 162 includes a memory module 150 that includes a Power-On Reset Detector Integrated Circuit (IC) 156, a Secure Memory IC 152, and an Analog-to-Digital (A/D) Converter IC 154. Each of the ICs 152, 154, 156 act in concert to implement the memory modules 150 described above with respect to FIG. 1. Thus, the memory module 150 implemented by a single electronic assembly 162 of FIG. 1B is equivalent to the multiple memory modules 103a, 103b, . . . 103x discussed above with respect to FIG. 1A. To enable a single electrical connection to the memory module 150 to carry complete memory module 150 status (i.e., ready/busy/error) information, FIG. 1B illustrates the use of conventional open collector output circuits 159, 161 from the secure memory IC 152 and a zener diode 158. Other arrangements for carrying status information, including those described above with respect to FIG. 1A, may also be used, as will be appreciated by those of ordinary skill in the art. The crystal 170 can provide a precision time reference that performs a similar function as that of the clock channel 121 described with respect to FIG. 1A. Other arrangements for carrying status information, including those described above with respect to FIG. 1A, may also be used, as will be appreciated by those of ordinary skill in the art. FIG. 1B also illustrates the use of a resistor divider circuit 160 to generate the specific voltage required to assign the memory module 150 a desired address. Therefore, it will be appreciated that the remainder of the specification is discussed with respect to the embodiment described in FIG. 1A, that alternative embodiments in which memory modules are implemented with one or more ICs are also within the scope of the invention described herein.

Figure 1C:
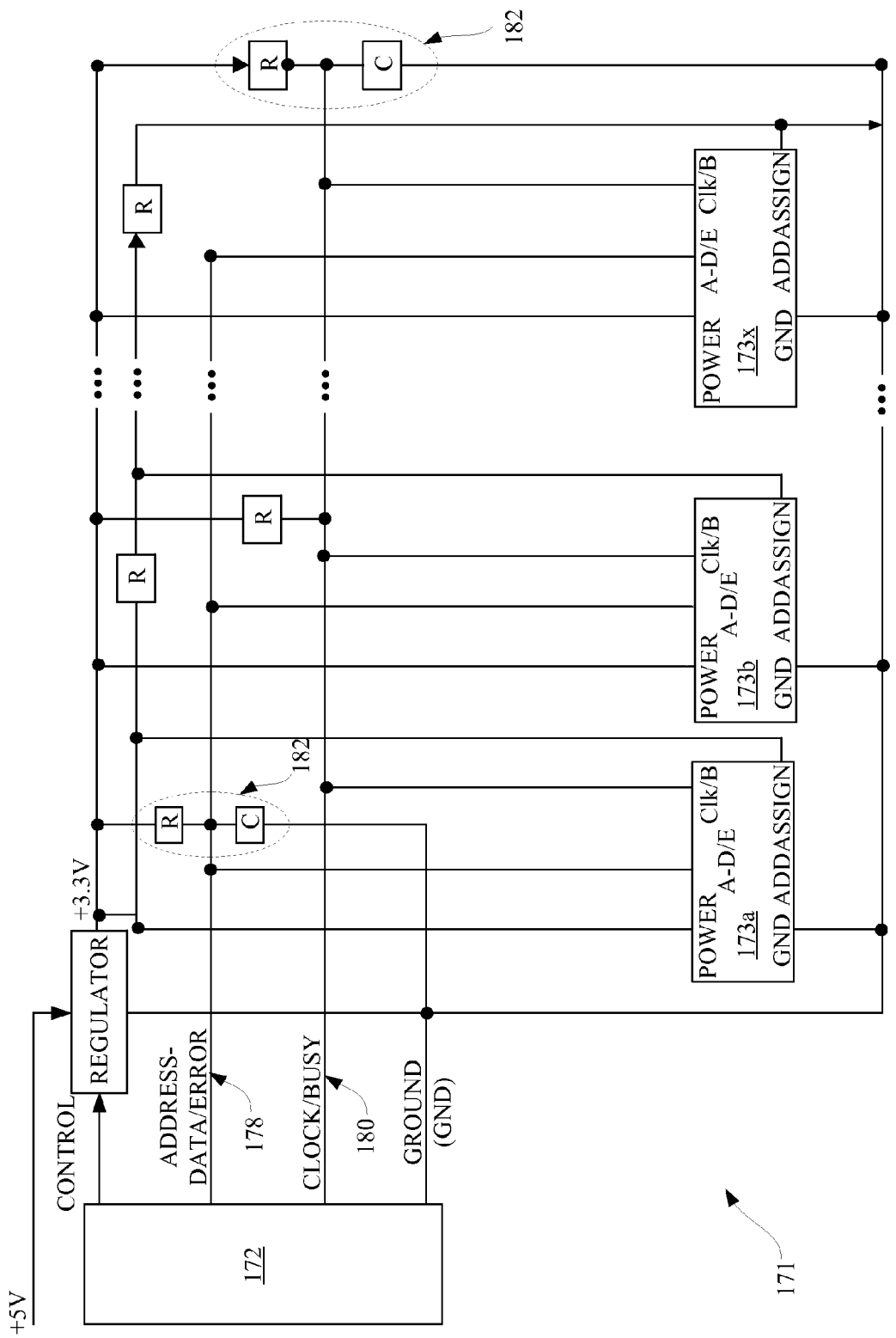
FIG. 1C is a schematic of an illustrative electrical interface, according to an embodiment of the present invention.

FIG. 1C shows another electrical interface 171 according to an illustrative embodiment of the present invention. The interface 171 includes a controlling computer system 172 in communication with a plurality of non-volatile memory modules 173a, 173b, . . . 173x, which implement the basic functions as the embodiments described with respect to FIGS. 1A and 1B. It will be appreciated that in the embodiments shown in FIGS. 1A and 1B, support for a common time reference is implemented either by a clock channel 121 or by a crystal circuit 170, which can increase the number of connections between the controlling computer system 101 and the memory modules 103a, 103b, . . . 103x or the incorporation of additional components into the memory modules 103a, 103b, . . . 103x, respectively. The electrical interface 171 illustrated in FIG. 1C encodes a binary clock with values 0 and 1, binary data transmission values of 0 and 1 along with busy status and error status information on two open drain, three-level channels. These channels are the Address-Data/Error channel 178 and the Clock/Busy channel 180.

When the Address-Data/Error 178 channel is at a low voltage it encodes a logical 0 data transmission state independent of whether any of the memory modules 173a, 173b, . . . 173x, are reporting an error condition. When the Address-Data/Error 178 is at an intermediate voltage level it encodes a logical 1 data transmission state and that at least one of the memory modules 173a, 173b, . . . 173x are reporting an error condition. When the Address-Data/Error 178 is at a high voltage level it encodes a logical 1 data transmission state and that none of the memory modules 173a, 173b, . . . 173x are reporting an error state. The clamping of the maximum voltage to the intermediate level, as opposed to the high voltage determined by the pull-up resistor and capacitor combinations 182 alone, can be achieved by the memory modules 173a, 173b, . . . 173x reporting an error state shorting the Address-Data/Error 178 to ground through a zener diode or similar component known in the art to limit the maximum voltage. When the Clock/Busy channel 180 is at a low voltage it encodes a logical 0 clock state independent of whether any of the memory modules 173a, 173b, . . . 173x, are reporting a busy condition. When the Clock/Busy channel 180 is at an intermediate voltage level it encodes a logical 1 clock state and that at least one of the memory modules 173a, 173b, . . . 173x are reporting a busy condition. When the Clock/Busy channel 180 is at a high voltage level it encodes a logical 1 clock state and that none of the memory modules 173a, 173b, . . . 173x are reporting a busy state. The clamping of the maximum voltage to the intermediate level, as opposed to the high voltage determined by the pull-up resistor and capacitor combinations 182 alone, is achieved by the at least one of the memory modules 173a, 173b, . . . 173x reporting the busy condition shorting the Clock/Busy channel 180 to ground through a zener diode or similar component so as to limit the maximum voltage.

II. Addressing Memory Modules

In order for a processing device to send commands and receive responses from a set of non-volatile memory modules distributed throughout a printing or imaging device, each of the memory modules are first assigned a memory module address according to an addressing scheme. Referring again to FIG. 1A, according to one aspect of the addressing scheme, the processing device 101 is capable of specifying a single memory module and an address or addresses location within the memory module that is to be read or modified. According to another aspect of the addressing scheme, an individual, multiple, or all of the memory modules may be issued the same command at the same time (e.g., a "broadcast" scheme). This allows a plurality of memory modules to be updated in parallel.

In accordance with another embodiment of the present invention, the commands described herein may also be issued to the memory modules 103a, 103b, . . . 103x using a split transaction scheme. The split transaction scheme may achieve nearly the same overall level of parallel processing as the broadcast scheme if the time to transmit commands and responses between the processing device 101 and the memory modules 103a, 103b, . . . 103x is relatively short when compared to the time actually needed to process and accomplish the task specified by the command. The time needed to accomplish the task specified by the command might be relatively long, for example, due to the time needed to change or replace the non-volatile memory contents of the memory modules 103a, 103b, . . . 103x or perhaps perform an intensive computation such as a cryptographic (e.g., encryption and/or decryption) operation as described in further detail below. Other commands that may require a relatively-long processing time include addressing commands, increment counter commands, punch out bit field commands, and other writing and/or computationally-intensive commands.

In a preferred embodiment, a split transaction scheme may be implemented where the memory modules 103a, 103b, 103x are operable to split the following operations into separate parts: 1) receive and verify the command to be free of transmission errors, 2) process the command (also referred to as "processing the commanded task"), and 3) report the final outcome of the command to the processing device 101. In this split transaction scheme, command-level synchronization using the status conditions (e.g., busy, error, etc.) described above can be used to determine whether a command has been received and/or processed by the addressed memory module 103a, 103b, 103x.

In an exemplary embodiment of the split transaction scheme, assuming that the memory modules 103a, 103b, 103x are ready, the processing device 101 can first issue a command to memory module 103a and then await for this memory device 103a to indicate the command was received without error. After a relatively-short amount of time, the memory device 103a can indicate to the processing device 101 that the command was received successfully by removing its busy status without indicating an error status. The memory device 103a may begin processing the command, which requires a relatively-lengthy operation time. The processing device 101 can then proceed to issue the same or similar command to the memory module 103b, where this transmission overlaps the lengthy processing time for memory module 103a. This overlapping of relatively-short command transmissions with relatively-lengthy processing times for the command can be repeated as desired. After transmitting and confirming the reception of the commands to all the memory modules 103a, 103b, . . . 103x as desired, the processing device 101 can poll the memory modules 103a, 103b, . . . 103x for indications that each has completed processing the command and is ready to accept another command.

Figure 8A:
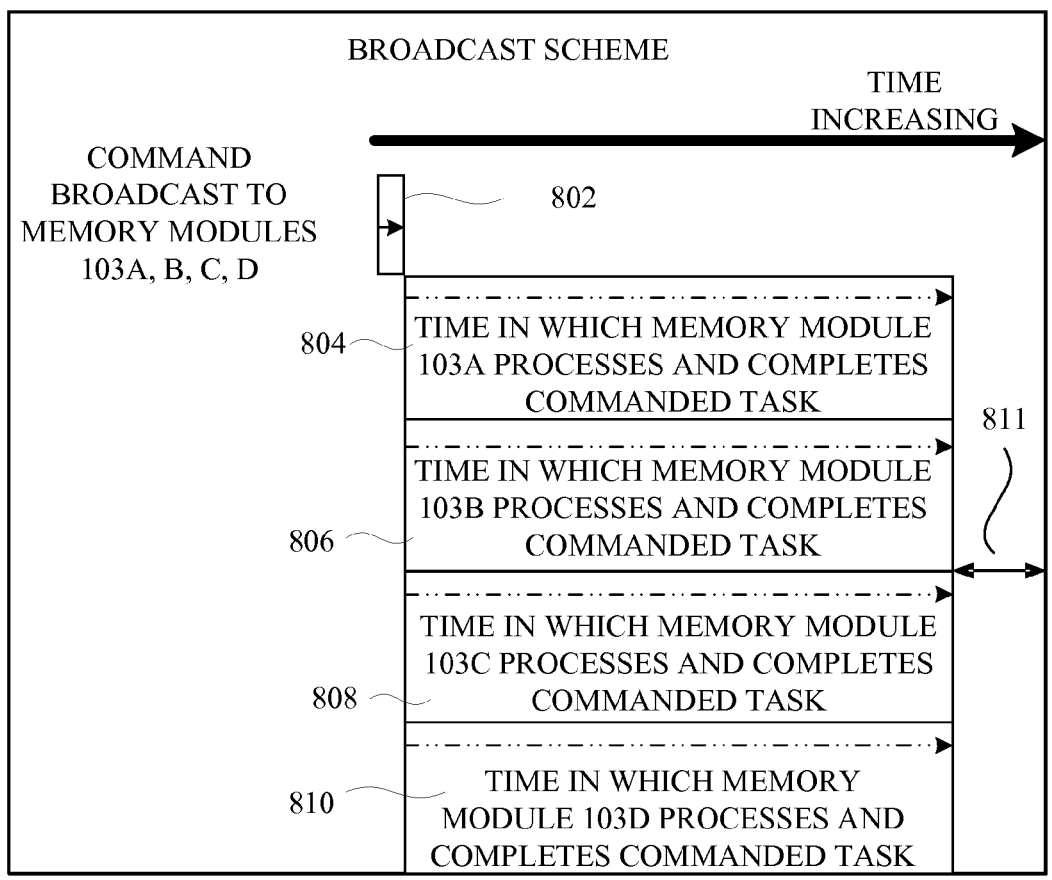
FIG. 8A is a time-flow diagram for a broadcast scheme, according to an embodiment of the present invention.
Figure 8B:
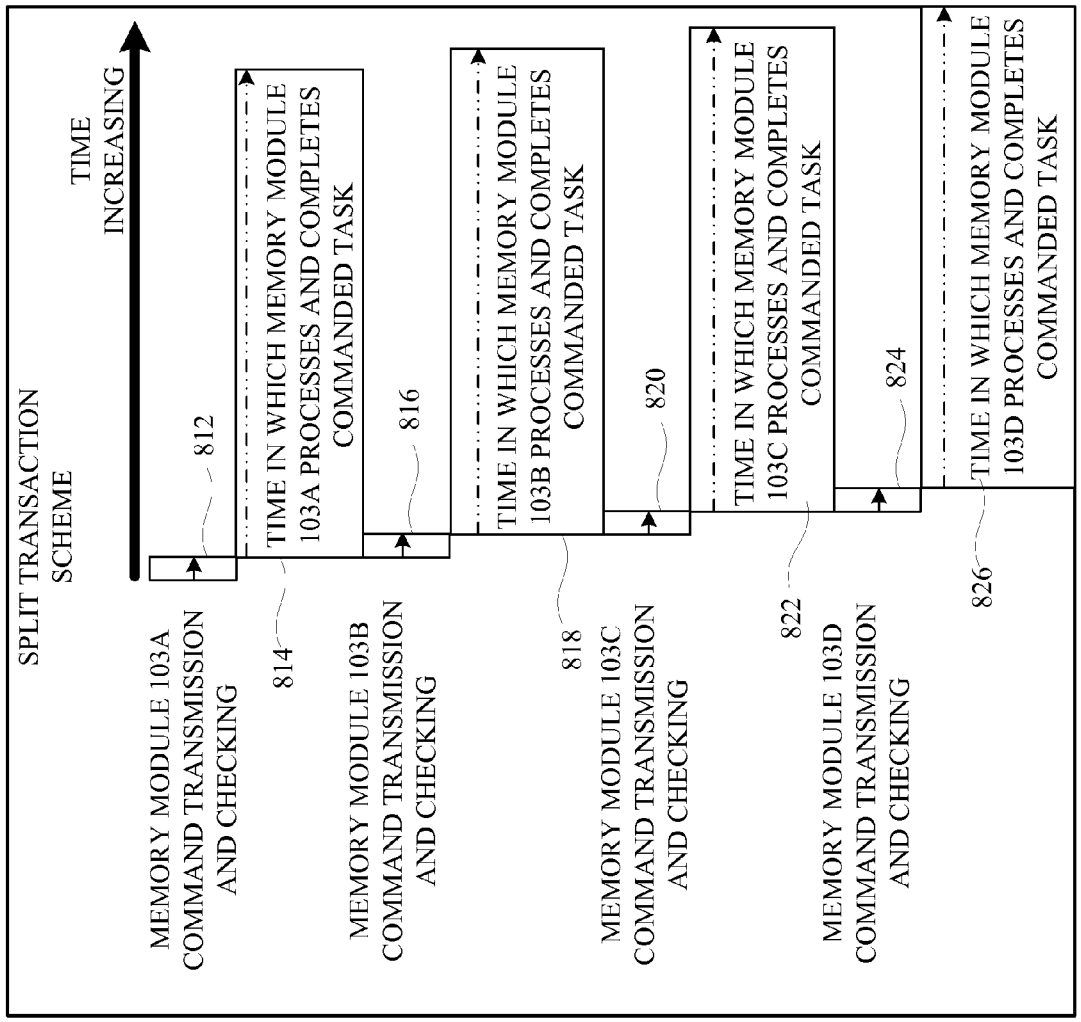
FIG. 8B is a time-flow diagram for a split transaction scheme, according to an embodiment of the present invention.

FIGS. 8A and 8B illustrate exemplary time-flow diagrams for broadcast and split transaction schemes, respectively. In both 8A and 8B, the command transmission time, including checking for command transmission errors, is relatively short while the command processing time is relatively long. For example, the command processing time may be substantially larger than the command transmission time, perhaps, about three to fifteen times greater than the command transmission time according to an exemplary embodiment. One of ordinary skill in the art will recognize that the ratio of the command processing time to the command transmission time may increase as the number of memory modules to be utilized with the split transaction scheme increases. The exemplary broadcast and split transaction schemes of FIGS. 8A and 8B will now be discussed below.

With respect to the broadcast scheme of FIG. 8A, the processing device 101 broadcasts a command to each of the memory modules 103a, b, c, d (block 802). Having received the command, each of the memory blocks 103a, b, c, d concurrently processes and completes the commanded task in the time illustrated by blocks 804, 806, 808, and 810, respectively. In comparison to the split transaction scheme of FIG. 8B described below, the amount of time gained 811 by the broadcast scheme of FIG. 8A can be small if, as here, the ratio of the command transmission time to the command processing time is small.

FIG. 8B illustrates a split transaction scheme that achieves nearly the same overall level of parallel processing as the broadcast scheme of FIG. 8A. In FIG. 8B, the processing device 101 may first determine, via one of the methods described herein, whether the memory modules 103a, b, c, d are ready to receive data. As illustrated in FIG. 8B, if the memory modules 103a, b, c, d are ready to receive data, the processing device 101 first transmits the command to the memory module 103a, and checks to ensure that the memory module 103a received the command without error (block 812). Once the processing device 101 confirms that the memory module 103a received the command without error, perhaps via a status condition, signal, or other indication on a channel as described herein, the processing device 101 then transmits a command to the memory module 103b (block 816) while the memory module 103a processes the commanded task (block 814).

Again, once the processing device 101 confirms that the memory module 103b received the command without error, the processing device 101 transmits a command to the memory module 103c (block 820) while the memory module 103b processes the commanded task (block 818). Similarly, once the processing device 101 confirms that the memory module 103c received the command without error, the processing device 101 transmits a command to the memory module 103d (block 820) while the memory module 103c processes the commanded task (block 818). The memory module 103d then processes the commanded task. When each of the memory modules 103a, b, c, d completes the commanded task, a status condition (e.g., ready, error) may be provided or updated for the processing device 101. One of ordinary skill will readily recognize that while four exemplary memory modules are described in FIGS. 8A and 8B, other embodiments may utilize fewer or more memory modules without departing from the present invention.

The split transaction scheme as illustrated in FIG. 8B may, in some instances, be easier to manage in comparison to the broadcast scheme of FIG. 8A because the error-free transmission of a command to each memory module is confirmed before the transmission of a command to the next memory module. By contrast, in the broadcast scheme illustrated in FIG. 8A, some memory modules may receive the command correctly and perform the commanded task, while other memory modules may not receive the command properly and would not be able to perform the task. Accordingly, error recovery from this broadcast scheme of FIG. 8A may be more complex than in the split transaction scheme of FIG. 8B to achieve the desired parallel processing. Further, if message authentication codes are used to insure that only commands received from authorized sources are executed, the use of the split transaction method may avoid the use of a single "initialization vector" value supplied to the memory modules 103a, 103b, . . . 103x from the processing device 101 for all broadcast commands. Because commands are transmitted to one memory module at a time in the split transaction scheme, the "initialization vector" used for each transmission operation provided to the processing device 101 by each memory module 103a, 103b, . . . 103x can be unique. One of ordinary skill in the art will readily recognize many variations of the split transaction scheme described above. For example, instead of commanding individual memory modules sequentially as described above, a first set of memory modules may be commanded followed by a second set of memory modules. In addition, in another alternative embodiment, the commands utilized with the respective memory modules in the broadcast scheme may not be the same commands, but rather one or more commands that are processed in a similar amount of time.

Returning back to the addressing of the memory modules, a variety of methods are possible for an addressing scheme. According to one embodiment, a singular addressing scheme may be applied to the memory modules. With a singular addressing scheme, a specified number of bits in a communications protocol are allocated for the "memory module address." As necessary, each of the bits (or at least a portion thereof) in the memory module address corresponds to a particular memory module. For example, as shown in FIG. 2A, if eight bits are allocated for the memory module address, and there are eight memory modules 103a, 103b, . . . 103h, each memory module may be assigned to one of the eight bits in the memory module address 200. Each of the memory modules 103a, 103b, . . . 103h will understand that it is being addressed when its corresponding bit in the memory module address 200 is at a specific state (e.g., high or a "1"). By setting a plurality of bits in the memory module address 200, the corresponding plurality of memory modules may be addressed simultaneously by the processing device 101. For instance, if memory modules 103c, 103d, and 103g are to be addressed at the same time, then the illustrative memory module address 202 shown in FIG. 2B may be utilized. Alternatively, if the split transaction scheme described above and illustrated in FIG. 8B is implemented, a binary-coded address or other unique memory module address can be used where any one command addresses only a single memory module using singular addressing.

A method by which memory modules are assigned an address under the singular addressing scheme will now be described in more detail. Many variations of address assignments are possible with commands or software activity. However, it is also possible to assign an address to a memory module without the use of issued commands or software. One embodiment is shown in FIG. 1A, in which a conductor 114 with a set of discrete voltage levels is provided through the use of resistors 118, and where each discrete voltage level corresponds to a particular bit position in the memory module address. Each of the plurality of memory modules 103a, 103b, . . . 103x will be in communication with the conductor 114, and will be assigned a memory module address based on the discrete voltage level of the conductor 114. For example, the discrete voltages of 3.3V may be provided for memory module 103a while a discrete voltage of 3.0V may be provided for memory module 103b. In this example, memory module 103a may be assigned the first bit position in the memory module address and memory module 103b may be assigned to the next bit position adjacent to the first bit position. The use of a single conductor 114 to assign addresses also reduces the number of connections required for implementing the addressing scheme, and simplifies the connections needed for memory modules packaged on removable components such as print cartridges.

According to an alternative embodiment, separate conductors, each with a discrete voltage, could be utilized with each of the memory modules 103a, 103b, . . . 103x. In yet another alternative embodiment, the specific address of a memory module may be assigned by a resistor divider circuit designed to produce a specific voltage level based upon the specific component of the imaging device. This would allow the reduction of another connection between the processing device 101 and the memory modules 103a, 103b, . . . 103x. In addition, according to another alternative embodiment, the address/data channel 108 could be utilized to program an address for each of the memory modules 103a, 103b, . . . 103x. According to yet another alternative embodiment of the present invention, the addresses of each of the memory modules 103a, 103b, . . . 103x may be pre-defined prior to its inclusion within the electrical interface 100.

Further, within each memory module 103a, 103b, . . . 103x, the addresses or locations that are to be read or modified may be assigned. According to one embodiment, the processing device 101 may assign the address or location by using a hardware strapping capability. As an example, the processing device 101 may provide that particular counts in each memory module 103a, 103b, . . . 103x will be assigned to a particular address or location. For example, within each memory module 103a, 103b, . . . 103x, a total page count may be assigned to one address, a number of printed color pages to a second address, a number of printed monochrome pages to a third address, a number of letter-sized printed pages to a fourth address, a number of legal-sized printed pages to a fifth address, and a number of printed transparencies to a sixth address, and so on. Further, the address or location in a memory module 103a, 103b, . . . 103x may be specified for resource usage bit fields that may be utilized in metering resource usage in print cartridges.

III. Command Protocols

Figure 3:
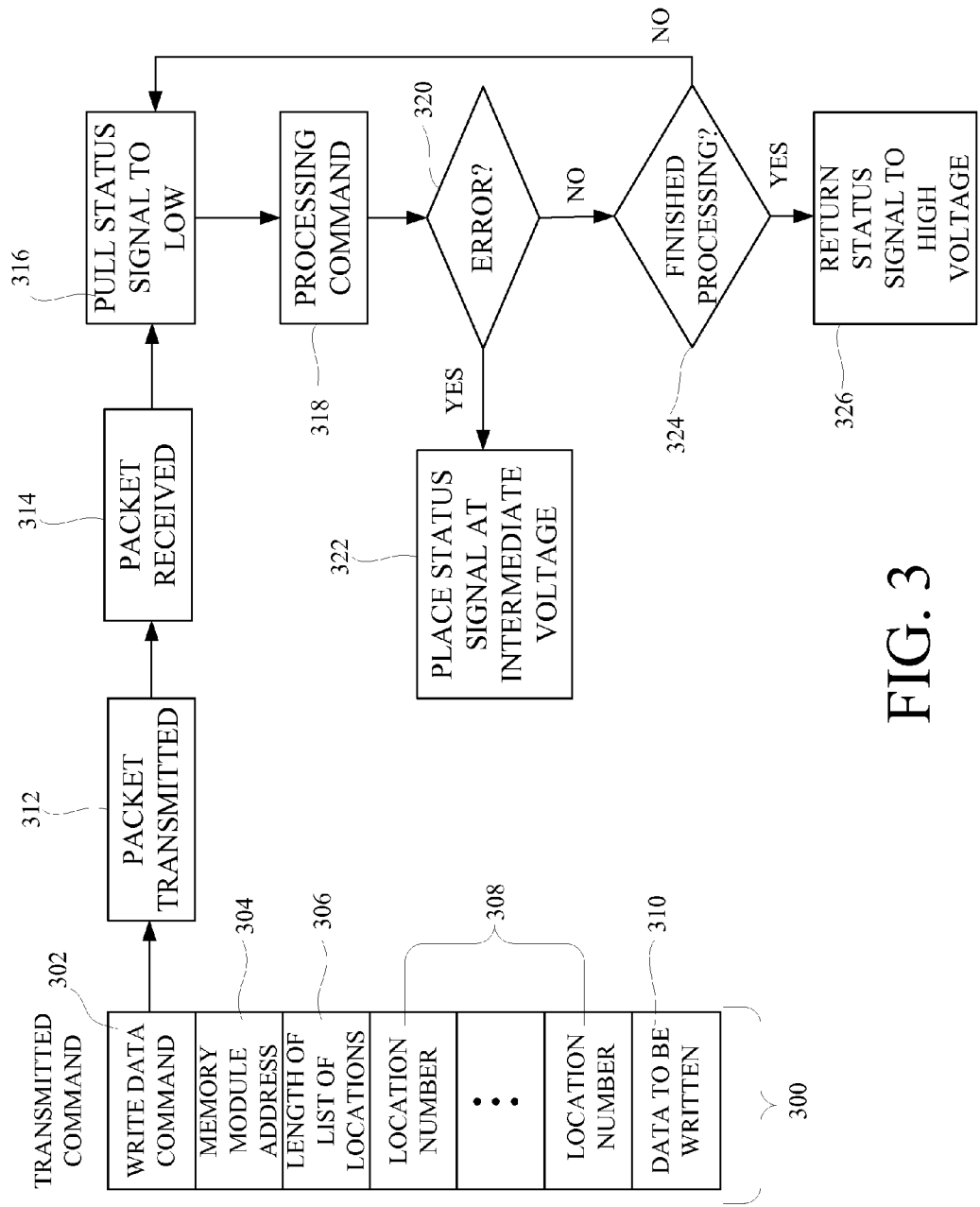
FIG. 3 is a block diagram flow chart of a write data operation, according to an illustrative embodiment of the present invention.

The command sets and protocols (also referred to as "command protocols") utilized in accordance with an embodiment of the present invention support the writing of data to and the reading of data from one or more memory modules 103a, 103b, . . . 103x. FIG. 3 is a block diagram flow chart of an exemplary write data command protocol that allows a specified value to be written to one or more locations in one or more memory modules 103a, 103b, . . . 103x. As shown in FIG. 3, the write data command protocol 300 includes sets of bits representing the write data command 302, the memory module address 304, the length of the list of locations 306, the corresponding locations 308, and the data to be written 310. The write data command 302 may be, for instance, an eight bit field representing the "write data" command. The memory module address 304 may be, for instance, a sixteen bit field utilizing singular addressing to indicate which of the potential sixteen memory modules 103a, 103b, . . . 103x the command 302 is addressed to. As indicated above with singular addressing, one memory module, a set of memory modules, or all of the memory modules 103a, 103b, . . . 103x may be addressed simultaneously by setting each of the respective bits in the memory module address to a "1". The length of the locations 306, perhaps an eight bit field, may indicate how many locations within each memory module 103a, 103b, . . . 103x are to be updated. Each of the location numbers 308 may be for instance, a sixteen bit field indicating the address of the location in the memory module 103a, 103b, . . . 103x that is to be updated. As an example, if four separate locations are to be updated, then the length of the list of locations 306 will be four, and there may be four separate sixteen-bit location numbers 308 specified. The data to be written 310 represents the specified data that is to be written in each of the locations 306.

Once the write data command protocol 300 is prepared, it is transmitted to each of the memory modules 103a, 103b, . . . 103x (blocks 312, 314) if the memory modules are all ready (e.g., status signal 110 at a high voltage level). If the memory module address 304 indicates that a particular memory module 103a, 103b, . . . 103x is being addressed, then each memory module 103a, 103b, . . . 103x that is being addressed pulls its status signal 110 to a low voltage to indicate a busy status (block 316) while it processes the write data command 302 (block 318). If the memory module 103a, 103b, . . . 103x encounters an error while processing the write data command 302 (block 320), its status signal 110 may be placed at an intermediate voltage level to indicate an error (block 322). Assuming no error is encountered, each addressed memory module 103a, 103b, . . . 103x will write the data value 310 to each of the locations 306. When the write data command 302 is completed (block 324), the memory module 103a, 103b, . . . 103x releases its status signal from a low voltage level to a high voltage level to signify completion of the command 302 (block 326).

In addition to the writing of specified data values to particular locations, command protocols are also supported in order to have one or more counters incremented. According to one embodiment of the invention, another command protocol of the present invention is an increment counter command protocol, which permits the memory modules to receive an increment counter command. With an increment counter command, each memory module may include a counter that maintains its own count, which is increased by a specified value upon receipt of the increment counter command. The increment counter command may be utilized with a plurality of counters with different counts—for example global page counts, color page counts, letter-sized page counts, legal-sized paged counts, transparency page counts, etc. Thus, the global page count, the color page count, the letter-sized page counts, and the transparency page counts in one or more memory modules 103a, 103b, . . . 103x may be incremented at the same time, which makes it unnecessary for the processing device 101 to know of the present values of each of those counts that are being updated. Instead, each memory module 103a, 103b, . . . 103x is responsible for maintaining its own counts and updating the counts upon receipt of the increment counter command protocol.

Figure 4:
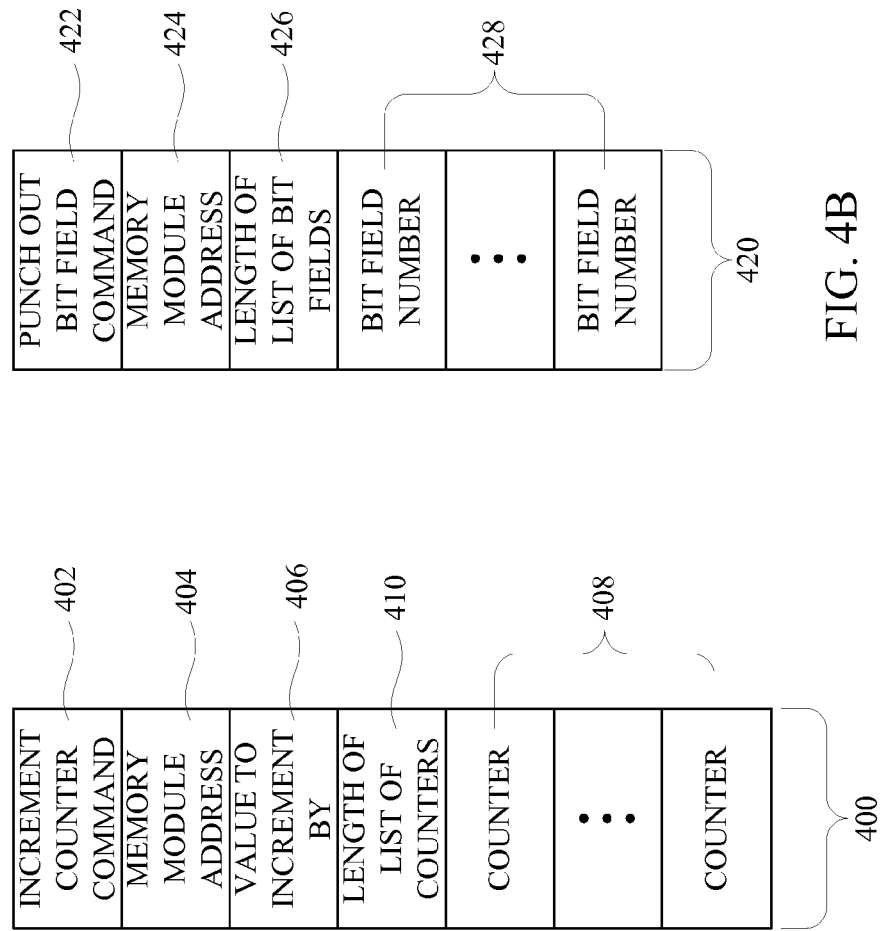
FIGS. 4A and 4B are illustrative command protocols, according to an embodiment of the present invention.

As shown in FIG. 4A, similar to the write data command protocol 300, the increment counter protocol 400 includes a set of bits allocated for the increment counter command 402, the memory module address 404, the value that each counter will increment by 406, the length of the list of counters 408, and the address of each counter to increment within the memory module 410. According to one illustrative example, the increment counter command 402 may be eight bits, the memory module address 404 may be sixteen bits, the value that each counter will increment by 406 may be eight bits, the length of the list of counters 408 may be eight bits, and the address of each counter 410 may be sixteen bits. Each memory module 103a, 103b, . . . 103x that is addressed will pull the signal on the status channel 110 to a low voltage to signify that it is busy while it updates one or more counters by the value specified. The memory module 103a, 103b, . . . 103x will release the signal on the status channel 110 to a high voltage to signify that it is ready after each addressed counter has been updated.

Referring next to FIG. 4B, the protocol 420 for commands to punch out a resource bit field is shown, according to one embodiment of the invention. The punch out protocol 420 includes a plurality of bits allocated for the punch out bit field command 422, the memory module address 424, the length of list of bit-field numbers to address 426, and the address of each bit field number in the memory module 428. According to one illustrative embodiment, the punch out bit field command 422 may be eight bits, the memory module address 424 may be sixteen bits, the length of the list of bit-field numbers 426 may be eight bits, and the address of each bit field number 428 may be sixteen bits. No data value needs to be specified because the punch out bit field command 422 does not require that a memory module 103a, 103b, . . . 103x update a particular value, but only to punch out a particular bit field (e.g., changed from an erased state to a programmed state).

Figure 5:
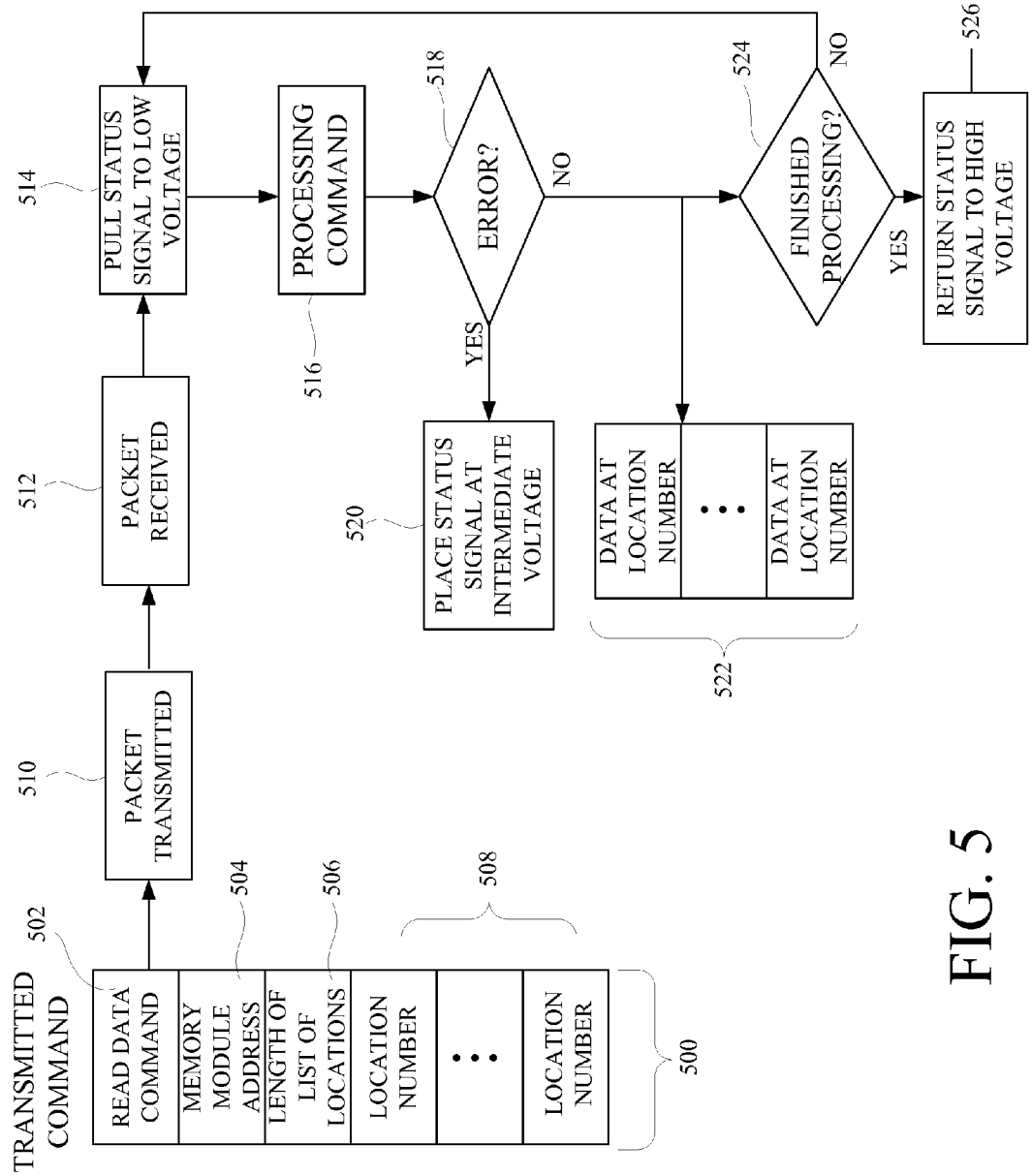
FIG. 5 is a block diagram flow chart of a read data operation, according to an illustrative embodiment of the present invention.

FIG. 5 is block diagram flow chart of an exemplary read data command protocol that allows the processing device 101 to query a particular memory module 103a, 103b, . . . 103x for a stored value. The read data command protocol 500 differs from the write command protocols above in that the addressed memory module 103a, 103b, . . . 103x sends data 522 back to the processing device 101. Referring to FIG. 5, the read data command protocol 500 includes sets of bits representing the read data command 502, the memory module address 504, the length of the list of locations 506, and the corresponding locations 508. For example, the command 502 may consist of an eight bit long command representing the "read" data command for a memory module 103a, 103b, . . . 103x. The memory module address 504 may be a sixteen bit field utilizing singular addressing to indicate which of the potential sixteen memory modules 103a, 103b, . . . 103x the command is addressed to. The length of the list of locations 506, perhaps an eight bit field, will indicate how many locations within each memory module 103a, 103b, . . . 103x are to be read. Each of the location numbers 508 may be perhaps a sixteen bit field indicating the address of the location in the memory module 103a, 103b, . . . 103x that is to be read.

Once the read data command protocol 500 is prepared, it is transmitted to each of the memory modules 103a, 103b, . . . 103x (blocks 510 and 512) assuming that the memory modules 103a, 103b, . . . 103x are ready (e.g., the status signal 110 is at a high voltage). If the memory module address 504 indicates that a particular memory module 103a, 103b, . . . 103x is being addressed, then the memory module 103a, 103b, . . . 103x that is being addressed pulls its status signal 110 to a low voltage to signify a busy status (block 514) while it processes the read data command 502 (block 516). If the memory module 103a, 103b, . . . 103x encounters an error while processing the read data command 502, then its status signal 110 may be pulled to an intermediate voltage level to signify an error status (block 520). Assuming no error is encountered, data 522 retrieved from the requested location numbers will be sent to the processing device 101. Once the write command has been completed (block 524), the memory module releases its signal on the status channel 110 from a low voltage level to a high voltage level (block 526).

Figure 6:
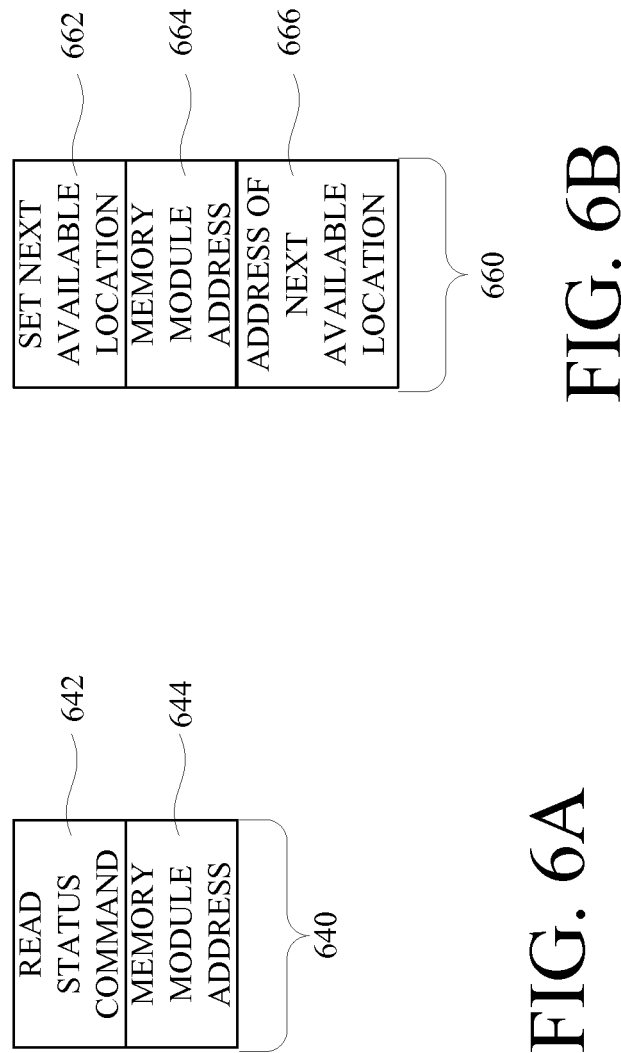
FIGS. 6A and 6B are illustrative command protocols according, to an embodiment of the present invention.

Because the memory modules 103a, 103b, . . . 103x may sometimes report errors by holding the status channel 110 at an intermediate voltage level, a command protocol to read the status of the memory modules is needed. When the processing device 101 detects that an error has occurred, it may individually query each of the memory modules 103a, 103b, . . . 103x with a "read status" command 642. As illustrated in FIG. 6A, this protocol 640 may include a set of bits representing the read status command 642 and the memory module address 644. The read status command 642 may be, for instance, eight bits and the memory module address 644 may be sixteen bits. After processing the read status command 642, the addressed memory module 103a, 103b, . . . 103x may then respond with its current status and return its status channel 110 to the Ready status (e.g., a high voltage level).

One error that a memory module 103a, 103b, . . . 103x may report is that one of its counters is not maintaining a value as expected. This may occur because particular locations in the non-volatile memory modules 103a, 103b, . . . 103x may degrade over time with use. In such a situation, the processing device 101 may send a command to set the next available location. As shown in FIG. 6B, this protocol 660 may include a set of bits representing the set next available location command 662, the memory module address 664, and the address of the next available location 666. According to an illustrative example, the set next available location 662 may be eight bits, the memory module address 664 may be sixteen bits, and the address of the next available location 666 may be sixteen bits. In an alternative embodiment of the present invention, the set next available location command protocol 660 may not be necessary if each memory module 103a, 103b, . . . 103x is able to automatically remap a counter or bit field to a new address or location without assistance from the processing device 101. According to yet another alternative embodiment of the present invention, one or more reserved memory modules may be provided such that a faulty memory module may be remapped to one of the reserved memory modules, either automatically or with assistance from the processing device 101.

One of ordinary skill will recognize that many variations and additions to the described command protocols are possible. For example, a different number of bits may be used for the memory module addresses and for the address/locations in the command protocols. For example, eight bits or twenty-four bits may be used for the memory module address as well to accommodate fewer or more memory modules 103a, 103b, . . . 103x. In addition, the fields contained in each of the command protocols may be rearranged in other orders as well. For example, in the write data command protocol 300, the data that is to be written 310 could be placed between the memory module address 304 and the length of the locations 306. In addition, horizontal parity bits, vertical parity bits, or both may be used with the transmitted protocols for checking and resolving transmission errors. Further, for security purposes, authentication may be utilized between the memory modules 103a, 103b, . . . 103x and processing device 101. For example, in FIG. 3, the data 310 may be encrypted prior its transmission to the memory modules 103a, 103b, . . . 103x. In such a case, the memory module will be responsible for decrypting the data 310. A variety of encryption algorithms known in the art may be utilized, including an RSA encryption algorithm (e.g., 1024-bit, 2048-bit, etc.) that utilizes asymmetrical keys (e.g., public and private keys). If encryption/decryption is utilized, then the command protocols may also support reading asymmetric keys and accepting asymmetric keys from the processing device 101 and memory modules 103a, 103b, . . . 103x. In addition, the memory modules 103a, 103b, . . . 103x, including those provided with print cartridges, may include serial numbers to authenticate the manufacturer of the cartridges. Accordingly, a command protocol may be supported in order to read the serial number from the memory module. The read serial number command protocol may include a set of bits for the read serial number command and the memory module address. A memory module 103a, 103b, . . . 103x that receives the read serial number command protocol will respond with its serial number.

Figure 7:
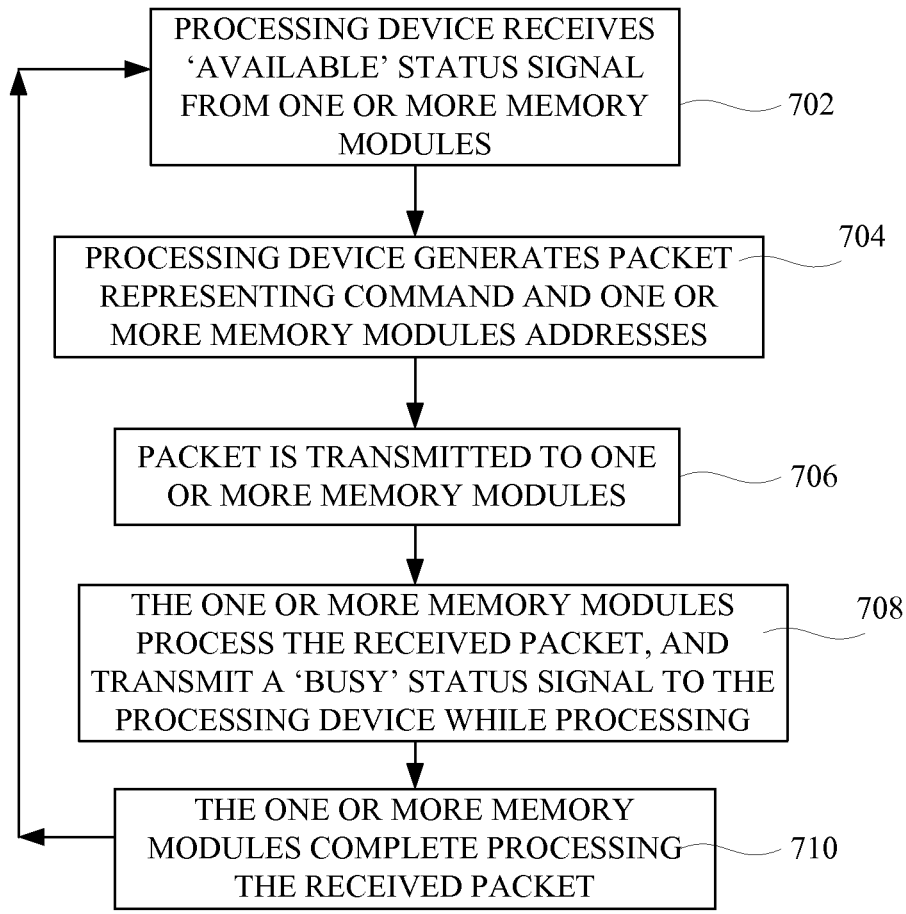
FIG. 7 shows a block diagram flow chart illustrating a method of communicating with one or more memory modules, according to one embodiment of the present invention.

FIG. 7 shows a block diagram flow chart illustrating a method of communicating with one or more memory modules, such as one or more non-volatile memory modules, according to one embodiment of the present invention. As shown in FIG. 7, the method may begin with a processing device, such as the illustrative processing device 101 of FIG. 1A, receiving a status signal from one or more memory modules (block 702) instructing the processing device that the one or more memory modules are prepared to receive data. According to one embodiment of the invention, the one or more memory modules may be one or more of the memory modules 103a, 103b, . . . 103x illustrated in FIG. 1A. The status signal may be an 'available' status signal, as described in detail above. Next, the processing device generates a packet including a command and one or more memory module addresses (block 704) to which the command will be transmitted. According to one aspect of the invention, the command is an increment counter command to increment one or more of the memory modules by an increment value also included in the command. According to other aspects of the invention, the command may include a punch out bit field command, and/or a write data command, both of which were described above. Referring again to FIG. 7, after the processing device transmits the packet to the one or more memory modules (block 706), the one or more memory modules process the received packet and transmit a 'busy' status signal to the processing device while processing the packet (block 708). After the one or more memory modules complete processing the packet (block 710), an available status signal may be sent to the processing device, which receives the status (block 702) so that additional commands may be sent to the one or more memory modules.

Figure 9:
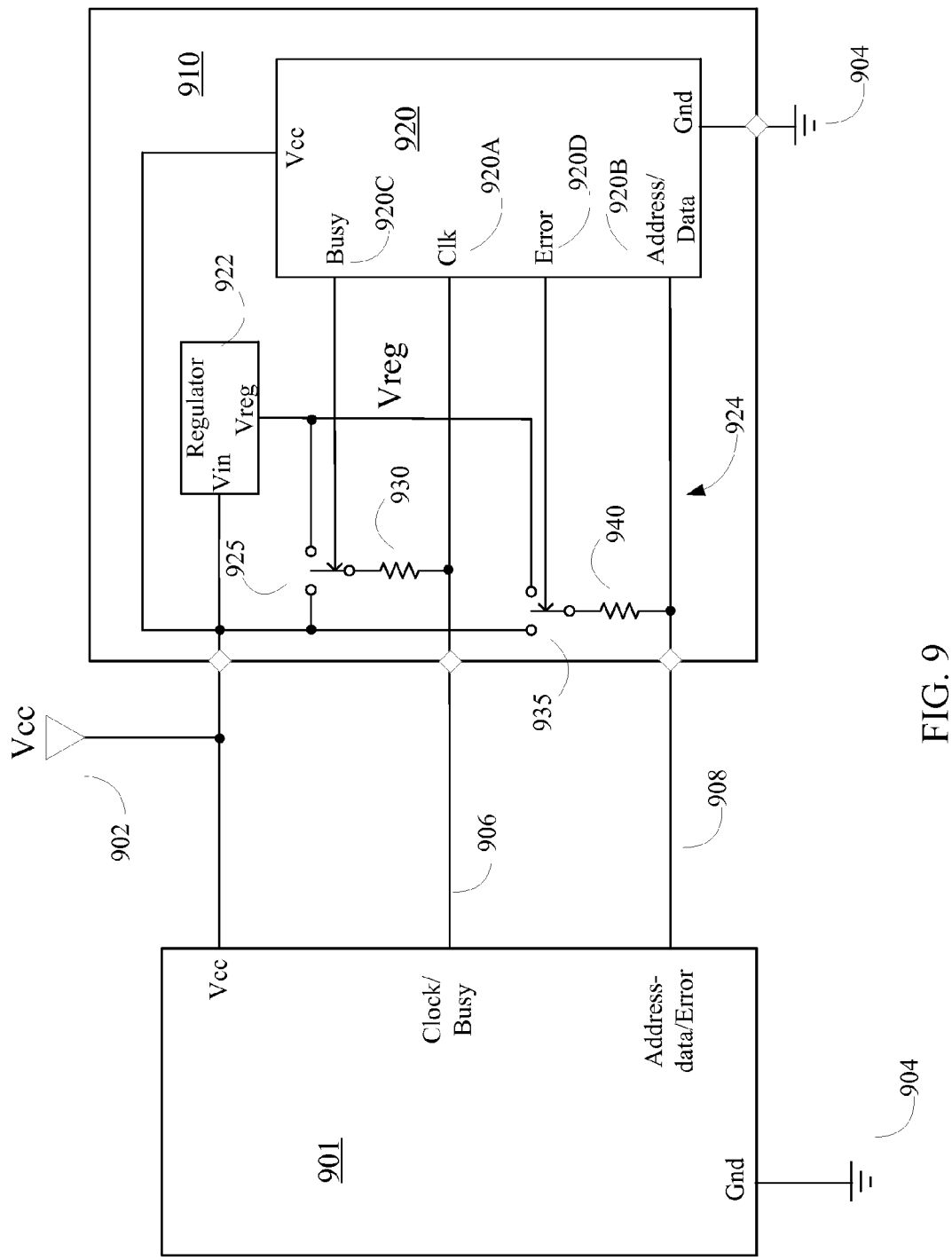
FIG. 9 is a schematic of an electrical interface according to another example embodiment.

FIG. 9 is a schematic of an illustrative electrical interface according to an example embodiment. Referring to FIG. 9, there is shown processing device 901 coupled to electronic assembly 910. Processing device 901 includes a supply voltage input port or pin Vcc for coupling to a Vcc power supply 902, and a ground input port or pin GND coupled to a ground reference 904. The processing device further includes a clock/busy bidirectional port or pin connected to clock/busy signal line 906 and a bidirectional address-data/error port or pin connected to address/data signal line 908. Each of the clock/busy bidirectional port and the address-data/error port may have an open drain (or open collector) output for forming an open drain (open collector) connection with electronic assembly 910, as discussed further below.

Electronic assembly 910 includes a memory module 920 having a clock (Clk) input port or pin 920A coupled to clock/ busy signal line 906 for receiving a clock signal from processing device 101, and an address-data port or pin 920B coupled to address-data/error signal line 908 for receiving and transmitting address and data information with processing device 101. Memory module 920 further includes a busy output port or pin 920C coupled to clock/busy signal line 906 for communicating the occurrence of a busy condition to processing device 101, and an error output port or pin 920D coupled to address-data/error signal line 908 for communicating the occurrence of an error condition to processing device 101. In addition, memory module 920 includes a port or pin coupled to Vcc power supply 902 and a ground port or pin coupled to ground reference 904.

Similar to electrical interface 171 of FIG. 1C, the electrical interface of FIG. 9 allows for electronic assembly 910 to communicate on clock/busy signal line 906 the occurrence of a busy condition to processing device 901 as processing device 901 provides a clock signal to electronic assembly 910, and to communicate on address-data/error signal line 908 the occurrence of an error condition to processing device 901 as processing device 901 communicates address/data information to electronic assembly 910. Specifically, electronic assembly 910 includes a voltage regulator 922 which is coupled to Vcc power supply 902 at its input Vin and provides a regulated voltage Vreg at its output. In an example embodiment, regulated voltage Vreg is greater than the voltage of Vcc power supply 902. Voltage regulator 922 is a boost (or step-up) regulator but it is understood that other types of regulators may be employed. In an example embodiment, Vcc power supply 902 may be at 3.3 v and regulated voltage Vreg may be 5.0 v, but it is understood that other voltage levels may be utilized in which the voltage level of regulated voltage Vreg is greater than the voltage level of Vcc power supply 902. Though FIG. 9 shows voltage regulator 922 as part of electronic assembly 910, it is understood that voltage regulator 922 may be external thereto.

Electronic assembly 910 may further include interface circuitry 924 for communicatively coupling processing device 901 and memory module 910. Specifically, interface circuitry 924 allows for processing device 901 to provide a clock signal to memory module 920 on clock/busy signal line 906 while memory module 920 selectively provides busy status information to processing device 901 on the same clock/busy signal line 906. Interface circuitry 924 also allows for processing device 901 to provide address or data information to memory module 920 on address-data/error signal line 908 while memory module 920 selectively provides error status information to processing device 901 on the same address-data/error signal line 908. In this way, each signal line 906, 908 is capable of having an increased function so that additional signal lines do not need to be utilized, thereby saving cost and space.

According to an example embodiment, interface circuitry 924 includes a switch 925 and pull-up resistor 930 for coupling clock/busy signal line 906 either to Vcc power supply 902 or to regulated voltage Vreg, via pull-up resistor 930. Specifically, switch 925 has a first terminal coupled to Vcc power supply 902, a second terminal coupled to regulated voltage Vreg, and a common terminal coupled to pull-up resistor 930, with a second terminal of pull-up resistor 930 coupled to clock/busy signal line 906. The control terminal of switch 925 is coupled to the busy output port 920C of memory module 920 such that the busy status signal generated by memory module 920 and placed on busy output port 920C determines whether clock/busy signal line 906 is coupled to Vcc voltage supply 902 or to regulated voltage Vreg. In an example embodiment, the busy status signal being in a first binary logic state causes Vcc voltage supply 902 to be coupled to pull-up resistor 930, and the busy status signal being in a second binary logic state causes regulated voltage Vreg to be coupled to pull-up resistor 930.

Interface circuitry 924 further includes a switch 935 and pull-up resistor 940 for coupling address-data/error signal line 908 either to Vcc power supply 902 or regulated voltage Vreg, via pull-up resistor 940. Specifically, switch 935 has a first terminal coupled to Vcc power supply 902, a second terminal coupled to the output of voltage regulator 922 and a common terminal coupled to pull-up resistor 940, with a second terminal of pull-up resistor 940 being coupled to address-data signal line 908. The control terminal of switch 935 is coupled to the error output port 920D of memory module 920 such that the error status signal generated by memory module 920 on error output port 920D determines whether address-data/error signal line 908 is coupled to Vcc voltage supply 902 or to regulated voltage Vreg. In an example embodiment, the error status signal being in the first binary logic state causes Vcc voltage supply 902 to be coupled to pull-up resistor 940, and the busy status signal being in the second binary logic state causes regulated voltage Vreg to be coupled to pull-up resistor 940.

Switches 925 and 935 may each be a single-pole, double-throw (SPDT) switch but it is understood other switch types or switching circuits may be utilized.

The communication between processing device 901 and memory module 920 will be described with respect to the block diagram of FIG. 9 and the signal diagram of FIG. 10. Processing device 901 may, for example, begin communication with memory module 920 by supplying a clock signal thereto over clock/busy signal line 906 and serially sending address and/or data to memory module over address-data/error signal line 908. Initially, memory module 920 has no error condition or busy condition to report to processing device 901. The busy output signal generated by memory module 920 is thus in the first binary state (binary state zero, in this embodiment) which causes Vcc power supply 902 to be coupled to pull-up resistor 930, and the error output signal generated by memory module 920 is in the first binary state which causes Vcc power supply 902 to be coupled to pull-up resistor 940. As a result, signal lines 906 and 908 are pulled up to the Vcc voltage supply 902 when the open-drain output of the clock/busy and address-data/error ports, respectively, of processing device 901 are undriven or released, and pulled to the ground potential when the open-drain output of such ports are driven. This occurs during time period TP1 in FIG. 10. Processing device 901, when reading the voltage levels on signal lines 906 and 908, due to clock/busy and address-data/error ports being bidirectional ports, detects high voltage levels at supply voltage Vcc and determines that memory module 920 has no busy condition or error condition being reported.

During communications with processing device 901, if memory module 920 enters a busy state or otherwise experiences a busy condition, such as due to needing a longer period of time to complete a task assigned to it by processing device 901, busy output port 920C is driven to the second binary state (binary one state) which causes regulated voltage Vreg to be coupled to pull-up resistor 930. At this point, instead of clock/busy signal line 906 being pulled to the Vcc power supply when a binary one value is placed thereon, clock/busy signal line 906 is pulled to the higher, regulated voltage Vreg. Processing device 901 is able to sense the clock/busy signal line 906 being pulled to regulated voltage Vreg and in response determine that memory module 920 is in a busy state or condition, which is illustrated in FIG. 10. When the busy condition or state has elapsed, memory module 920 drives its busy output port 920C back to the first binary state, which couples clock/busy signal line 906 to Vcc power supply 902 such that a binary one value on clock/busy signal line 906 reaches the Vcc power supply level.

Figure 10:
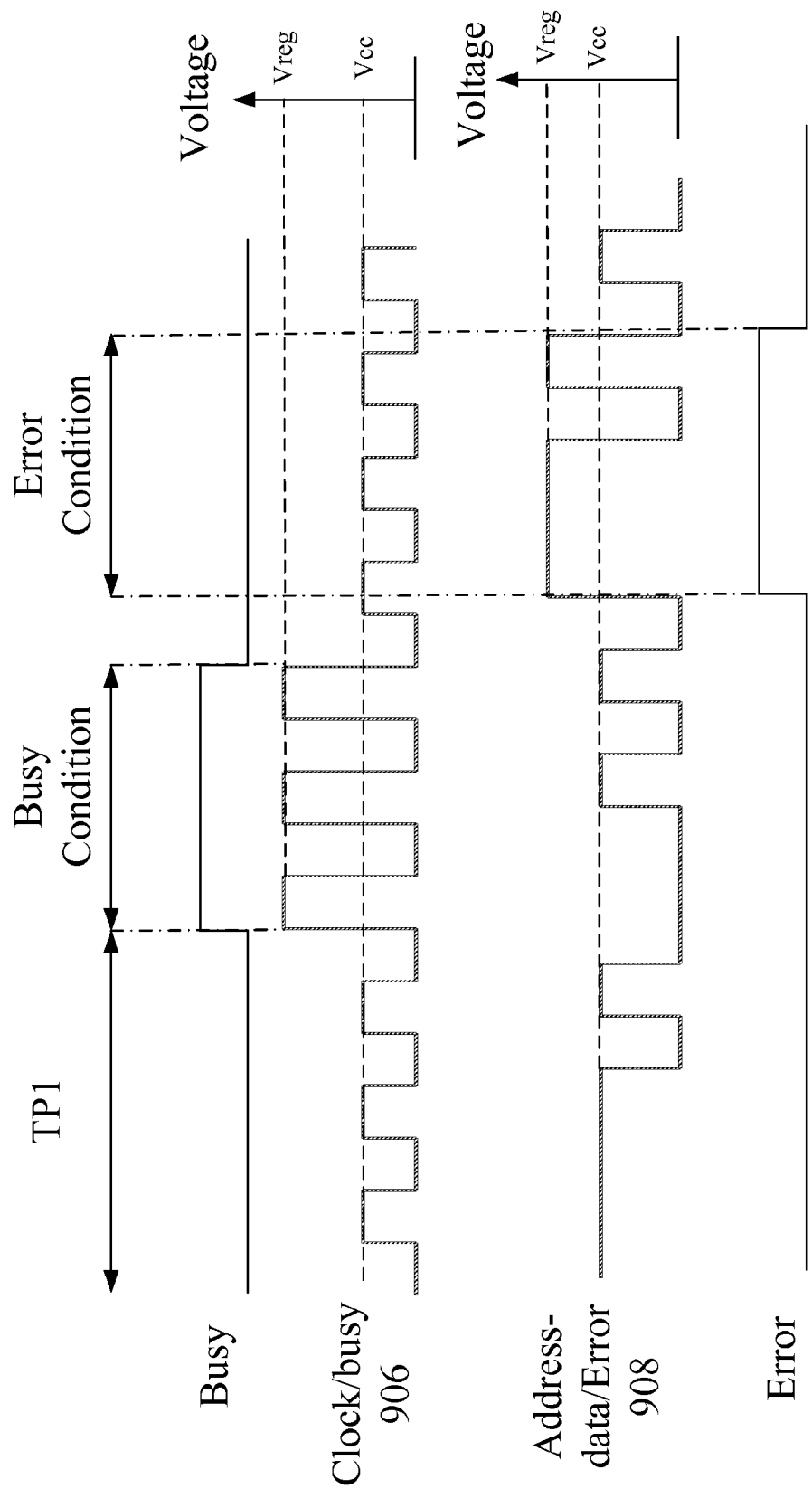
FIG. 10 is a signal diagram illustrating the operation of the electrical interface of FIG. 9.

In the example embodiment illustrated in FIG. 10, during communications with processing device 901, if memory module 920 enters an error state or otherwise experiences an error condition, error output port 920D is driven to the second binary state which causes regulated voltage Vreg to be coupled to pull-up resistor 940. At this point, instead of address-data/error signal line 908 being pulled up to the Vcc power supply when a binary one value is placed therein, signal line 908 is pulled to the higher, regulated voltage Vreg. Processing device 901 is able to sense address-data/error signal line 908 being pulled to regulated voltage Vreg and in response determine that memory module 920 is reporting an error condition or having entered an error state (FIG. 10). When the error condition no longer exists, memory module 920 drives error port 920D back to the first binary state, which couples address-data/error signal 908 to Vcc power supply 902 such that a binary one value on address-data/error signal 908 reaches the Vcc power supply level.

Figure 11:
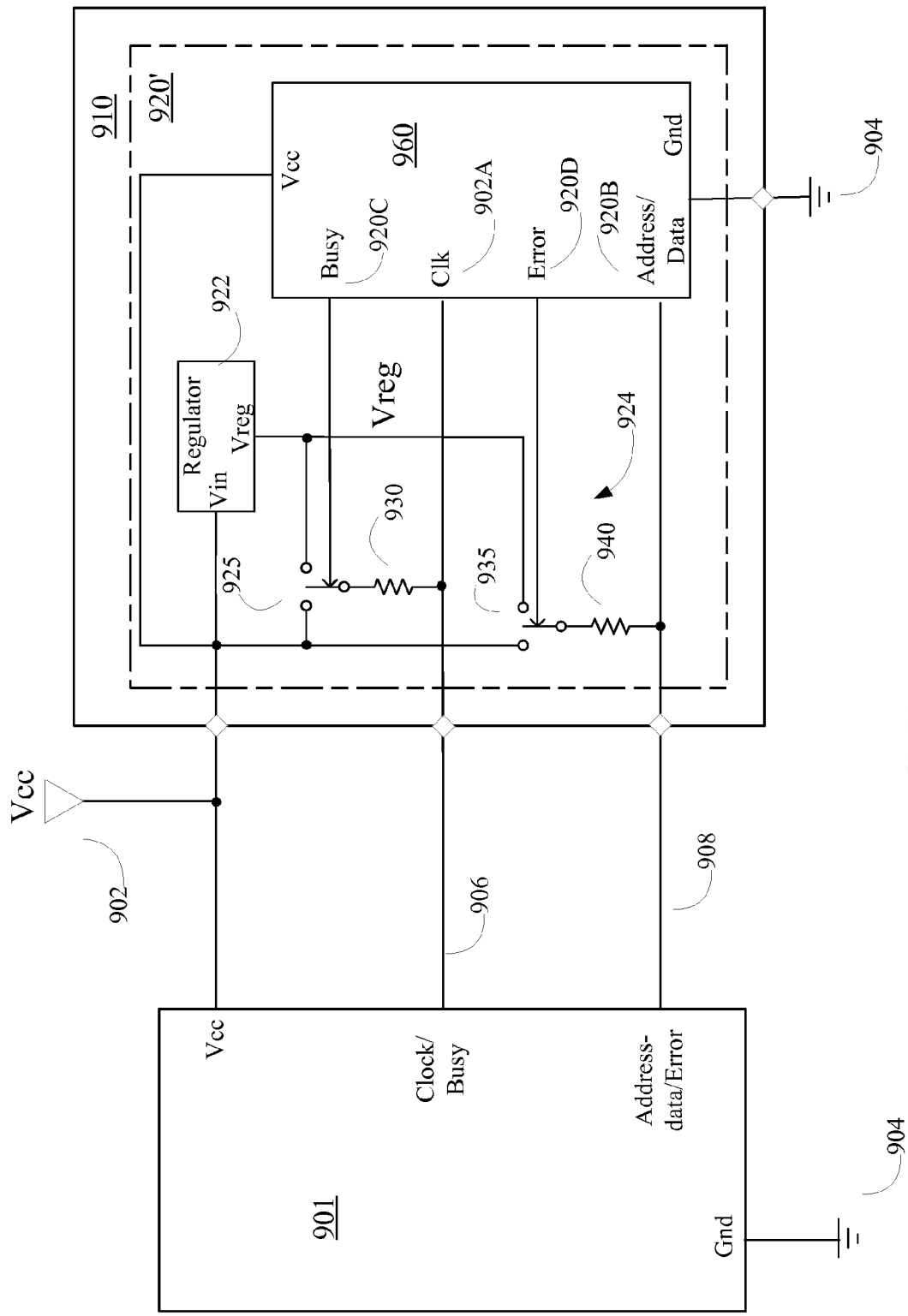
FIG. 11 is a schematic of an electrical interface according to another example embodiment.

In the embodiment described above in connection with FIG. 9, voltage regulator 922 and switching circuitry 924 are shown as being separate from memory module 920. In an alternatively embodiment, voltage regulator 922 and switching circuitry 924 are part of memory module 920. FIG. 11 depicts such an embodiment in which memory module 920' includes switching circuitry 924, voltage regulator 922 and memory block 960. In this embodiment, memory block 960 includes memory cells, receives address and data information for performing operations include memory access operations, generates and places a busy signal at busy output port 920C, and generates an places an error signal at error output port 920D.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A memory module, comprising:
a plurality of memory cells; and
a plurality of signal lines for communicating with a processing device, the memory module configured such that upon encountering a first condition while processing a command received by the memory module, the memory module limits a voltage on a first signal line of the plurality of signal lines to be no more than an intermediate voltage greater than voltage levels corresponding to a binary zero state and less than voltage levels corresponding to a binary one state for a period of time for indicating an occurrence of the first condition,
wherein the memory module is configured to receive a first signal on the first signal line, and during the period of time the memory module limits a voltage on the first signal line to be no greater than the intermediate voltage, a voltage level on the first signal line corresponding to the binary zero state is interpreted by the memory module as a binary zero state of the first signal and the intermediate voltage on the first signal line is interpreted by the memory module as a binary one state of the first signal such that during the period of time, the memory module receives the first signal on the first signal line while at the same time the memory module communicates the occurrence of the first condition on the first signal line to the processing device,
wherein the first signal comprises a clock signal and the first condition comprises a busy condition.

2. The memory module of claim 1, wherein upon encountering a second condition while processing the command, the memory module limits a voltage on a second signal line of the plurality of signal lines to be no more than a second intermediate voltage greater than voltage levels corresponding to the binary zero state and less than voltage levels corresponding to the binary one state for a second period of time for indicating an occurrence of the second condition, wherein the memory module is configured to receive a second signal on the second signal line, and during the second period of time the memory module limits a voltage on the second signal line to be no greater than the second intermediate voltage, a voltage level on the second signal line corresponding to the binary zero state is interpreted by the memory module as a binary zero state of the second signal and the second intermediate voltage on the second signal line is interpreted by the memory module as a binary one state of the second signal such that during the second period of time, the memory module receives the second signal on the second signal line while at the same time the memory module communicates the occurrence of the second condition on the second signal line to the processing device, and wherein the second signal comprises an address-data signal and the second condition comprises an error condition.

3. The memory module of claim 1, further comprising at least one electrical component coupled between the first signal line and a ground potential such that the memory module passes current through the at least one electrical component for limiting the voltage on the first signal line to be no more than the intermediate voltage.

4. The memory module of claim 3, wherein the intermediate voltage is based at least in part upon a resistance of the at least one electrical component.

5. The memory module of claim 3, wherein the at least one electrical component comprises at least one resistor.

6. The memory module of claim 3, wherein the at least one electrical component comprises at least one diode.

7. An apparatus, comprising:
a first signal line for communicating clock and busy status information;
a second signal line for communicating address, data and error status information; and
a memory module configured to receive and process commands, comprising a plurality of memory cells and circuitry, coupled to the first signal line and the second signal line, for changing, during a period of time, an upper voltage level for a binary signal appearing on at least one of the first signal line and the second signal line in response to encountering at least one condition of the memory module during processing of a command, the upper voltage level being a voltage level that is not exceeded by the binary signal appearing on the at least one of the first signal line and the second signal line, the changing comprising switching the upper voltage level from a first voltage to a second voltage for indicating an occurrence of the at least one condition by the memory module, the first voltage being a voltage at which the memory module is powered and the second voltage being different from the first voltage, wherein the at least one of the first signal line and the second signal line comprises the first signal line, the apparatus receives a clock signal on the first signal line, and the at least one condition comprises a busy status condition, wherein the second voltage comprises an intermediate voltage greater than voltage levels corresponding to a binary zero state and less than voltage levels corresponding to a binary one state, and wherein during the period of time the memory module switches the upper voltage level on the first signal line to be the intermediate voltage, a voltage level on the first signal line corresponding to the binary zero state is interpreted by the memory module as a binary zero state of the clock signal and the intermediate voltage on the first signal line is interpreted by the memory module as a binary one state of the clock signal such that during the period of time, the memory module receives the clock signal on the first signal line while at the same time the memory module communicates the occurrence of the busy status condition on the first signal line to a processing device.

8. The apparatus of claim 7, wherein the apparatus receives an address-data signal on the second signal line, a second condition comprises an error status condition, and upon encountering the second condition when processing the command, the memory module changes the upper voltage level on the second signal line for a second period of time to be the intermediate voltage, a voltage level on the second signal line corresponding to the binary zero state is interpreted by the memory module during the second period of time as a binary zero state of the address-data signal and the intermediate voltage on the second signal line is interpreted by the memory module as a binary one state of the address-data signal such that the memory module receives the address-data signal on the second signal line during the second period of time while at the same time the memory module indicates an occurrence of the error status condition on the second signal line to the processing device.

9. The apparatus of claim 7, wherein the circuitry includes at least one of a resistor and a diode coupled between the first signal line and a ground potential.

10. The apparatus of claim 7, wherein the circuitry includes at least one electrical component coupled between the first signal line and a ground potential such that the second voltage is based at least in part upon current passing through or a voltage appearing across the at least one electrical component.

11. A memory device, comprising:
a first signal line for receiving, by the memory device, clock information;
a second signal line for communicating address and data information; and
a plurality of memory cells and circuitry coupled to the first signal line and the second signal line, the circuitry setting an upper voltage level on at least one of the first signal line and the second signal line for a period of time in response to encountering at least one condition of the memory device during processing of a command, the upper voltage level being a voltage level that is not exceeded by a binary signal appearing on the at least one of the first signal line and the second signal line during the period of time, the setting comprising changing the upper voltage level on the at least one of the first signal line and the second signal line from a first voltage to a second voltage different from the first voltage, the second voltage comprising an intermediate voltage greater than voltage levels corresponding to a binary zero state and less than voltage levels corresponding to a binary one state when the upper voltage level comprises the first voltage, wherein the at least one of the first signal line and the second signal line comprises the first signal line and the at least one condition comprises a busy condition such that the circuitry changes the upper voltage level on the first signal line to the intermediate voltage for the period of time in response to encountering the busy condition, the changed upper voltage level indicating the busy condition by the memory device, wherein during the period of time the memory device changes the upper voltage level on the first signal line to the intermediate voltage, a voltage level on the first signal line corresponding to the binary zero state is interpreted by the memory device as a binary zero state of the clock information and the intermediate voltage on the first signal line is interpreted by the memory device as a binary one state of the clock information such that during the period of time, the memory device receives the clock information on the first signal line while at the same time the memory device communicates the busy condition on the first signal line to a processing device.

12. The memory device of claim 11, wherein the circuitry changes the upper voltage level on the second signal line from the first voltage to a third voltage, different from the first voltage, for a second period of time in response to encountering an error condition, the third voltage on the second signal line indicating the error condition by the memory device.

13. The memory device of claim 12, wherein the third voltage comprises a second intermediate voltage greater than voltage levels corresponding to the binary zero state and less than voltage levels corresponding to the binary one state, and during the second period of time the memory device changes the upper voltage level on the second signal line to the second intermediate voltage, a voltage level on the second signal line corresponding to the binary zero state is interpreted by the memory device as a binary zero state of the address and data information and the second intermediate voltage on the second signal line is interpreted by the memory device as a binary one state of the address and data information such that during the second period of time, the memory device receives the address and data information on the second signal line while at the same time the memory device communicates the error condition on the second signal line to the processing device.

14. The memory device of claim 11, further comprising at least one electrical component disposed between the first signal line and a ground reference, wherein the upper voltage level on the first signal line during the period of time is based at least in part upon a voltage across the at least one electrical component.

15. The memory device of claim 11, further comprising at least one electrical component disposed between the first signal line and a ground reference, wherein the upper voltage level on the first signal line during the period of time is based at least in part upon a current passing through the at least one electrical component.

16. The memory device of claim 13, wherein the second intermediate voltage is the same as the intermediate voltage.

* * * * *